United States Patent
Banks

(10) Patent No.: US 7,068,542 B2
(45) Date of Patent: Jun. 27, 2006

(54) MEMORY APPARATUS INCLUDING PROGRAMMABLE NON-VOLATILE MULTI-BIT MEMORY CELL, AND APPARATUS AND METHOD FOR DEMARCATING MEMORY STATES OF THE CELL

(75) Inventor: Gerald J. Banks, Fremont, CA (US)

(73) Assignee: BTG International Inc., West Conshohocken, PA (US)

(*) Notice: Subject to any disclaimer, the term of this patent is extended or adjusted under 35 U.S.C. 154(b) by 39 days.

(21) Appl. No.: 10/944,194

(22) Filed: Sep. 20, 2004

(65) Prior Publication Data

US 2005/0030816 A1 Feb. 10, 2005

Related U.S. Application Data

(60) Division of application No. 10/742,890, filed on Dec. 23, 2003, which is a division of application No. 10/188,835, filed on Jul. 5, 2002, now Pat. No. 6,714,455, which is a division of application No. 09/893,545, filed on Jun. 29, 2001, now Pat. No. 6,434,050, which is a division of application No. 09/733,937, filed on Dec. 12, 2000, now Pat. No. 6,353,554, which is a continuation of application No. 09/493,139, filed on Jan. 28, 2000, now abandoned, which is a division of application No. 09/411,315, filed on Oct. 4, 1999, now Pat. No. 6,246,613, which is a division of application No. 08/975,919, filed on Nov. 21, 1997, now Pat. No. 6,002,614, which is a continuation-in-part of application No. 08/410,200, filed on Feb. 27, 1995, now Pat. No. 5,764,571.

(51) Int. Cl.
G11C 16/04 (2006.01)

(52) U.S. Cl. .............. 365/185.29; 365/185.2; 365/185.22

(58) Field of Classification Search ............ 365/185.29, 365/185.22, 185.2, 185.27, 185.23, 185.24
See application file for complete search history.

(56) References Cited

U.S. PATENT DOCUMENTS 3,660,819 A 5/1972 Frohman-Bentchkowsky ........ 317/235 R (Continued)

FOREIGN PATENT DOCUMENTS

EP 0 390 404 10/1990
EP 0 725 403 8/1996

(Continued)

OTHER PUBLICATIONS

Torelli, Guido et al., "An Improved Method for Programming a Word–Erasble EEPROM", *Alta Frequenza—Scientific Review in Electronics*, vol. LII, No. 6, pp. 487–494 (1983).

(Continued)

*Primary Examiner*—Son T. Dinh
*Assistant Examiner*—Hien Nguyen
(74) *Attorney, Agent, or Firm*—Miles & Stockbridge P.C.

(57) ABSTRACT

Memory states of a multi-bit memory cell are demarcated by generating read reference signals having levels that constitute boundaries of the memory states. The read reference signals may be dependent upon the levels of programming reference signals used for controlling the programming of the memory cell. The memory cell can thus be programmed without reading out its memory state during the programming process, with programming margins being assured by the dependence of the read reference signals on the programming reference signals. Both sets of reference signals may be generated by reference cells which track variations in the operating characteristics of the memory cell with changes in conditions, such as temperature and system voltages, to enhance the reliability of memory programming and readout.

21 Claims, 26 Drawing Sheets

U.S. PATENT DOCUMENTS

| | | |
|---|---|---|
| 3,755,721 A | 8/1973 | Frohman-Bentchkowsky ........ 317/235 R |
| 3,801,965 A | 4/1974 | Keller et al. .......... 340/173 R |
| 4,004,159 A | 1/1977 | Rai et al. ................... 307/238 |
| 4,054,864 A | 10/1977 | Audaire et al. ........ 340/173 R |
| 4,090,258 A | 5/1978 | Cricchi ...................... 365/184 |
| 4,122,541 A | 10/1978 | Uchida ....................... 365/154 |
| 4,139,910 A | 2/1979 | Anantha et al. ............ 365/183 |
| 4,149,270 A | 4/1979 | Cricchi et al. .............. 365/222 |
| 4,181,980 A | 1/1980 | McCoy ......................... 365/45 |
| 4,192,014 A | 3/1980 | Craycraft ................... 365/104 |
| 4,272,830 A | 6/1981 | Moench ....................... 365/45 |
| 4,287,570 A | 9/1981 | Stark ........................ 365/104 |
| 4,300,210 A | 11/1981 | Chakravarti et al. ......... 365/45 |
| 4,306,300 A | 12/1981 | Terman et al. ............... 365/45 |
| 4,327,424 A | 4/1982 | Wu ............................ 365/104 |
| 4,357,685 A | 11/1982 | Daniele et al. ............ 365/189 |
| 4,388,702 A | 6/1983 | Sheppard .................... 365/104 |
| 4,415,992 A | 11/1983 | Adlhoch ..................... 365/94 |
| 4,417,325 A | 11/1983 | Harari ....................... 365/185 |
| 4,448,400 A | 5/1984 | Harari ....................... 365/185 |
| 4,449,203 A | 5/1984 | Adlhoch ..................... 365/104 |
| 4,462,088 A | 7/1984 | Giuliani et al. ............ 365/105 |
| 4,495,602 A | 1/1985 | Sheppard .................... 365/104 |
| 4,503,518 A | 3/1985 | Iwahashi .................... 365/104 |
| 4,558,241 A | 12/1985 | Suzuki et al. .............. 307/530 |
| 4,578,777 A | 3/1986 | Fang et al. ................. 365/184 |
| 4,586,163 A | 4/1986 | Koike ........................ 365/104 |
| 4,612,629 A | 9/1986 | Harari ....................... 365/185 |
| 4,627,027 A | 12/1986 | Rai et al. ................... 365/45 |
| 4,653,023 A | 3/1987 | Suzuki et al. .............. 365/104 |
| RE32,401 E | 4/1987 | Belistein, Jr. et al. ...... 365/182 |
| 4,661,929 A | 4/1987 | Aoki et al. ................. 365/189 |
| 4,701,884 A | 10/1987 | Aoki et al. ................. 365/189 |
| 4,709,350 A | 11/1987 | Nakagome et al. ........... 365/45 |
| 4,733,394 A | 3/1988 | Giebel ....................... 371/21 |
| 4,771,404 A | 9/1988 | Mano et al. ................. 365/189 |
| 4,799,195 A | 1/1989 | Iwahashi et al. ............ 365/185 |
| 4,809,224 A | 2/1989 | Suzuki et al. .............. 365/168 |
| 4,847,808 A | 7/1989 | Kobatake .................... 364/104 |
| 4,853,892 A | 8/1989 | Hori .......................... 365/49 |
| 4,890,259 A | 12/1989 | Simko ........................ 365/45 |
| 4,903,236 A | 2/1990 | Nakayama et al. ........... 365/185 |
| 4,914,631 A | 4/1990 | Johnson et al. .......... 365/189.11 |
| 4,964,079 A | 10/1990 | Devin ........................ 365/168 |
| 4,989,179 A | 1/1991 | Simko ........................ 365/45 |
| 5,014,242 A | 5/1991 | Akimoto et al. .............. 365/63 |
| 5,021,999 A | 6/1991 | Kohda et al. ............... 365/168 |
| 5,043,940 A | 8/1991 | Harari ....................... 365/168 |
| 5,095,344 A | 3/1992 | Harari ....................... 357/23.5 |
| 5,163,021 A | 11/1992 | Mehrotra et al. ............ 365/185 |
| 5,168,465 A | 12/1992 | Harari ....................... 257/320 |
| 5,172,338 A | 12/1992 | Mehrotra et al. ............ 365/185 |
| 5,198,380 A | 3/1993 | Harari ....................... 437/43 |
| 5,200,920 A | 4/1993 | Norman et al. ............... 365/185 |
| 5,200,959 A | 4/1993 | Gross et al. ............... 371/21.6 |
| 5,218,569 A | 6/1993 | Banks ....................... 365/189.01 |
| 5,258,958 A | 11/1993 | Iwahashi et al. ............ 365/210 |
| 5,262,984 A | 11/1993 | Noguchi et al. ............. 365/185 |
| 5,268,318 A | 12/1993 | Harari ....................... 437/43 |
| 5,268,319 A | 12/1993 | Harari ....................... 437/43 |
| 5,268,870 A | 12/1993 | Harari ....................... 365/218 |
| 5,272,669 A | 12/1993 | Samachisa et al. .......... 365/185 |
| 5,293,560 A | 3/1994 | Harari ....................... 365/185 |
| 5,295,255 A | 3/1994 | Malecek et al. ............. 395/425 |
| 5,299,165 A | 3/1994 | Kimura et al. ............... 365/210 |
| 5,307,304 A | 4/1994 | Saito et al. ................. 365/145 |
| 5,313,421 A | 5/1994 | Guterman et al. ............ 365/185 |
| 5,321,655 A | 6/1994 | Iwahashi et al. ............ 365/200 |
| 5,351,210 A | 9/1994 | Saito ...................... 365/189.01 |
| 5,422,842 A | 6/1995 | Cernea et al. ............... 365/185 |
| 5,422,845 A | 6/1995 | Ong .......................... 365/185 |
| 5,428,621 A | 6/1995 | Mehrotra et al. ........... 371/21.4 |
| 5,430,859 A | 7/1995 | Norman et al. ............... 395/425 |
| 5,432,735 A | 7/1995 | Parks et al. ................. 365/168 |
| 5,434,825 A | 7/1995 | Harari ....................... 365/185 |
| 5,438,546 A | 8/1995 | Ishac et al. ................. 365/200 |
| 5,440,505 A | 8/1995 | Fazio et al. .................. 365/45 |
| 5,444,656 A | 8/1995 | Bauer et al. .............. 365/189.01 |
| 5,450,363 A | 9/1995 | Christopherson et al. ... 365/205 |
| 5,457,650 A | 10/1995 | Sugiura et al. ............. 365/184 |
| 5,469,384 A | 11/1995 | Lacey .................... 365/185.13 |
| 5,475,693 A | 12/1995 | Christopherson et al. .. 371/10.2 |
| 5,485,422 A | 1/1996 | Bauer et al. ................. 365/168 |
| 5,487,033 A | 1/1996 | Keeney et al. .......... 365/185.19 |
| 5,495,442 A | 2/1996 | Cernea et al. .......... 365/185.03 |
| 5,497,119 A | 3/1996 | Tedrow et al. ............... 327/540 |
| 5,497,354 A | 3/1996 | Sweha et al. ............ 365/230.06 |
| 5,506,813 A | 4/1996 | Mochizuki et al. ..... 365/230.03 |
| 5,508,958 A | 4/1996 | Fazio et al. ............ 365/185.19 |
| 5,515,317 A | 5/1996 | Wells et al. ................. 395/427 |
| 5,523,972 A | 6/1996 | Rashid et al. ........... 365/185.22 |
| 5,539,690 A | 7/1996 | Talreja et al. ............ 365/185.22 |
| 5,541,886 A | 7/1996 | Hasbun ..................... 365/230.01 |
| 5,544,118 A | 8/1996 | Harari ....................... 365/218 |
| 5,546,042 A | 8/1996 | Tedrow et al. ............... 327/538 |
| 5,550,772 A | 8/1996 | Gill ........................ 365/185.03 |
| 5,553,020 A | 9/1996 | Keeney et al. .......... 365/185.19 |
| 5,554,553 A | 9/1996 | Harari ........................ 437/43 |
| 5,563,828 A | 10/1996 | Hasbun et al. ........... 365/185.33 |
| 5,566,125 A | 10/1996 | Fazio et al. .................. 365/45 |
| 5,568,439 A | 10/1996 | Harari ....................... 365/218 |
| 5,574,879 A | 11/1996 | Wells et al. ................. 395/427 |
| 5,583,812 A | 12/1996 | Harari ................... 365/185.33 |
| 5,594,691 A | 1/1997 | Bashir ................... 365/189.09 |
| 5,596,527 A | 1/1997 | Tomioka et al. ........... 365/185.2 |
| 5,642,312 A | 6/1997 | Harari ................... 365/185.33 |
| 5,657,332 A | 8/1997 | Auclair et al. ............ 371/40.11 |
| 5,659,550 A | 8/1997 | Mehrotra et al. ........... 371/21.4 |
| 5,671,388 A | 9/1997 | Hasbun ....................... 395/430 |
| 5,712,180 A | 1/1998 | Guterman et al. ............. 437/43 |
| 5,712,819 A | 1/1998 | Harari ................... 365/185.29 |
| 5,748,546 A | 5/1998 | Bauer et al. ................. 365/210 |
| 5,754,566 A | 5/1998 | Christopherson et al. ........................ 371/40.18 |
| 5,768,184 A | 6/1998 | Hayashi et al. ......... 365/185.03 |
| 5,776,810 A | 7/1998 | Guterman et al. .......... 438/258 |
| 5,781,472 A | 7/1998 | Sweha et al. ........... 365/185.11 |
| 5,796,667 A | 8/1998 | Sweha et al. ................ 365/207 |
| 5,801,991 A | 9/1998 | Keeney et al. .......... 365/185.23 |
| 5,802,553 A | 9/1998 | Robinson et al. ............. 711/103 |
| 5,806,070 A | 9/1998 | Norman et al. ............... 711/103 |
| 5,872,735 A | 2/1999 | Banks .................... 365/189.01 |
| 6,002,614 A | 12/1999 | Banks .................... 365/189.01 |
| 6,011,716 A | 1/2000 | Banks .................... 365/185.03 |
| 6,014,327 A | 1/2000 | Banks .................... 365/185.03 |
| 6,104,640 A | 8/2000 | Banks .................... 365/189.01 |
| 6,118,692 A | 9/2000 | Banks .................... 365/185.03 |
| 6,243,321 B1 | 6/2001 | Banks ........................ 365/233 |
| 6,246,613 B1 | 6/2001 | Banks .................... 365/189.01 |
| 6,324,121 B1 | 11/2001 | Banks .................... 365/185.03 |
| 6,327,189 B1 | 12/2001 | Banks .................... 365/189.01 |
| 6,339,545 B1 | 1/2002 | Banks .................... 365/185.03 |
| 6,343,034 B1 | 1/2002 | Banks ........................ 365/189 |
| 6,344,998 B1 | 2/2002 | Banks ................... 365/185.22 |
| 6,353,554 B1 | 3/2002 | Banks .................... 365/185.03 |
| 6,356,486 B1 | 3/2002 | Banks .................... 365/189.01 |
| 6,381,172 B1 | 4/2002 | Banks .................... 365/185.03 |
| 6,404,675 B1 | 6/2002 | Banks .................... 365/185.03 |
| 6,434,050 B1 | 8/2002 | Banks ..................... 365/185.2 |
| 6,714,455 B1 | 3/2004 | Banks ......................... 419/27 |

| | | |
|---|---|---|
| 2004/0136237 A1 | 7/2004 | Banks .................. 365/182.29 |

FOREIGN PATENT DOCUMENTS

| | | |
|---|---|---|
| FR | 2 630 574 | 10/1989 |
| JP | 56-114199 | 9/1981 |
| JP | 59-63095 | 4/1984 |
| JP | 61-239497 | 10/1986 |
| JP | 61-239498 | 10/1986 |
| JP | 62-6493 | 1/1987 |
| JP | 62-24499 | 2/1987 |
| JP | 1-159895 | 6/1989 |
| JP | 2-227900 | 9/1990 |
| JP | 3-242898 | 10/1991 |
| JP | 4-507320 | 12/1992 |
| JP | 5-217385 | 8/1993 |
| JP | 5-282881 | 10/1993 |
| JP | 6-68682 | 3/1994 |
| JP | 7-029383 | 1/1995 |
| JP | 7-161852 | 6/1995 |
| JP | 8-195092 | 7/1996 |
| JP | 8-274282 | 10/1996 |
| JP | 9-181279 | 7/1997 |
| WO | WO82/02276 | 7/1982 |
| WO | WO82/02976 | 9/1982 |
| WO | WO90/01984 | 3/1990 |

OTHER PUBLICATIONS

Yoshikawa, Kuniyoshi et al., "An Asymmetrical Lightly–Doped Source (ALDS) Cell for Virtual Ground High Density EPROMs", *IEEE International Electron Devices Meeting*, 1988, pp. 432–435.

M. Bauer et al, *A Multilevel–Cell 32Mb Flash Memory*, 1995 IEEE International Solid–State Circuits Conference, Session 7, Paper TA7.7.

John A. Bayliss et al., *The Interface Processor for the 32b Computer*, 1981 IEEE International Solid–State Circuits Conference, Feb. 1981, at 116–117.

Christoph Bleiker & Hans Melchior, *A Four–State EEPROM Using Floating–Gate Memory Cells*, IEEE Journal of Solid–State Circuits, vol. SC–22, No. 3, Jun. 1987, at 260–263.

Raymond A. Heald & David A. Hodges, *Multilevel Random–Access Memory Using One Transistor Per Cell*, IEEE Journal of Solid–State Circuits, vol. SC–11, No. 4, Aug. 1976, at 519–528.

David A. Rich, *A Survey of Multivalued Memories*, IEEE Transactions on Computers, vol. C–35, No. 2, Feb. 1986, at 99–106.

R.S. Withers et al., *Nonvolatile Analog Memory in MNOS Capacitors*, IEEE Electron Device Letters, vol. EDL–1, No. 3, Mar. 1980, at 42–45.

"Mid–Level Current Generator Circuits", IBM Technical Disclosure Bulletin, vol. 33, No. 1B, Jun. 1, 1990, pp. 386–388.

Bleiker, Christoph, and Melchior, Hans. "A Four–State EEPROM Using Floating–Gate Memory Cells." IEEE Journal of Solid–State Circuits, vol. SC–22, No. 3. (Jun. 1987) : 460–463.

Intel Corporation. "2764A Advanced 64K (8K×8) Production and UV Erasable PROMs." Memory Components Handbook. (Oct. 1985) : 4.10–4.20.

Chi, Min–hwa, and Bergemont, Albert. "Multi–level Flash/EPROM Memories: New Self–convergent Programming Methods for Low–voltage Applications." 1995 Technical Digest–International Electron Devices Meeting, (1995) : 271–274.

Aritome, Seiichi, et al. "A Novel Side–Wall Transfer–Transistor Cell (SWATT Cell) For Multi–Level NAND EEPROMs." 1995 Technical Digest–International Electron Devices Meeting. (1995) : 275–278.

Bauer, M., et al., "TA 7.7: A Multilevel–Cell 32Mb Flash Memory." 1995 IEEE International Solid–State Circuits Conference, 1995 Digest of Technical Papers. (1995) : 132–133.

Hemink, G.J., et al. "Fast and Accurate Programming Method for Multi–level NAND EEPROMs." 1995 Symposium on VLSI Technology Digest of Technical Papers. (1995) : 129–130.

Takeuchi, Ken, et al. "A Double–Level–$V_{th}$ Select Gate Array Architecture for Multi–Level NAND Flash Memories." 1995 Symposium on VLSI Circuits Digest of Technical Papers. (1995) : 69–70.

Gotou, Hiroshi. "New Operation Mode for Stacked–Gate Flash Memory Cell." IEEE Electron Device Letters, vol. 16, No. 3. (Mar. 1995) : 121–123.

Jung, Tae–Sung, et al. "TP 2.1: A 3.3V 128Mb Multi–Level NAND Flash Memory for Mass Storage Applications." 1996 IEEE International Solid–State Circuits Conference, 1996 Digest of Technical Papers. (1996) : 32–33.

Neale, Ron. "Will multi–level Flash memory be the way to the future?" Electronic Engineering (London), vol. 68, No. 835. (Jul. 1996): 3 pp.

Patton, Robert. "Flash makers taking conservative steps forward." Japanese Press Network. (Nov. 1996) : 2 pp.

Ohkawa, Masayoshi, et al. "TP 2.3: A 98mm$^2$ 3.3V 64Mb Flash Memory with FN–NOR Type 4–level Cell." 1996 IEEE International Solid–State Circuits Conference, 1996 Digest of Technical Papers. (1996) : 36–37.

Montanari, D., et al. "Multi–Level Charge Storage in Source–Side Injection Flash EEPROM." 1996 IEEE International NonVolatile Memory Technology Conference. (1996) : 80–83.

Atwood, Greg, et al. "Intel StrataFlash Memory Technology Overview." Intel Technology Journal. (Fourth quarter 1997) : 1–8.

Fazio, Al, and Bauer, Mark. "Intel StrataFlash Memory Technology Development and Implementation." Intel Technology Journal. (Fourth quarter 1997) : 1–13.

Intel Corporation. "Intel StrataFlash Memory Technology." Intel Technical Paper. (Sep. 1997) : 1–13.

Candelier, Ph., et al. "Hot Carrier Self Convergent Programming Method for Multi–Level Flash Cell Memory." 1997 35th Annual IEEE International Reliability Physics Symposium. (1997) : 104–109.

Intel Corporation. "Intel StrataFlash Memory Technology 32 and 64 Mbit." Intel Advance Information. (Jan. 1998) : 1–53.

Alberts, G.S., and Kotecha, H.N. "Multi–Bit Storage FET EAROM Cell." IBM Technical Disclosure Bulletin, vol. 24, No. 7A. (Dec. 1981) : 3311–3314.

Blyth, Trevor, et al. "TPM 11.7: A Non–Volatile Analog Storage Device Using EEPROM Technology." 1991 IEEE International Solid–State Circuits Conference, Digest of Technical Papers. (Feb. 1991) : 192–193 and 315.

Hanyu, T., et al. "Functionally separated, multiple–valued content–addressable memory and its applications." IEE Proceedings–Circuits Devices Systems, vol. 142, No. 3. (Jun. 1995) : 165–172.

English abstract of "Flash Memories–Interview with Intel Corporation Representative." Elektronik Praxis 30(10). (May 24, 1995) : 26–30.

Tran, Hieu Van, et al. "FP 16.6: A 2.5V 256–Level Non–Volatile Analog Storage Device Using EEPROM Technology." 1996 IEEE International Solid–State Circuits Conference. (Feb. 1996) : 270–271, 458, and 512.

Choi, Young–Joon, et al. "A High Speed Programming Scheme for Multi–Level NAND Flash Memory." 1996 Symposium on VLSI Circuits Digest of Technical Papers. (1996) : 170–171.

Giridhar, Raghupathy V. "Flash Technology: Challenges and Opportunities." Japanese Journal of Applied Physics, vol. 35 (1996), Part I, No. 12B, Review Papers. (Dec. 1996) : 6347–6350.

Gill, Manzur. "Flash Memories: A Review." 1996 IEEE International NonVolatile Memory Technology Conference. (1996) : 142. Abstract provided only.

Calligaro, C., et al. "Technological and Design Constraints for Multilevel Flash Memories." 1996 IEEE International Conference on Electronic Circuits and Systems. (1996) : 1005–1008.

Eitan, Boaz, et al. "Multilevel Flash cells and their Trade–offs." 1996 IEEE International Electron Devices Meeting. (1996) : 169–172.

Yoshikawa, Kuniyoshi. "Impact of Cell Threshold Voltage Distribution in the Array of Flash Memories on Scaled and Multilevel Flash Cell Design." 1996 Symposium on VLSI Technology Digest of Technical Papers. (1996) : 240–241.

Hanyu, Takahiro, et al. "Non–Volatile One–Transistor–Cell CAM and Its Applications." Methodologies for the Conception, Design, and Applications of Intelligent Systems, Proceedings of IIZUKA. (Oct. 1996) : 101–104.

Calligaro, C., et al. "Mixed Sensing Architecture for 64Mbit 16–Level–Cell Non–Volatile Memories." 1996 IEEE Innovative Systems in Silicon Conference. (Oct. 1996) : 133–140.

Hanyu, Takahiro, et al. "Design of a One–Transistor–Cell Multiple–Valued CAM." IEEE Journal of Solid–State Circuits, Brief Papers, vol. 31, No. 11. (Nov. 1996) : 1669–1674.

Kencke, D.L., et al. "A Sixteen Level Scheme Enabling 64Mbit Flash Memory Using 16Mbit Technology." 1996 International Electron Devices Meeting. (1996) : 937–939.

De Graaf, C., et al. "Feasibility of Multilevel Storage in Flash EEPROM Cells." Proceedings of the 25$^{th}$ European Solid State Device Research Conference. (Sep. 1995) : 213–216.

Aritome, Seiichi, et al. "A Side–Wall Transfer–Transistor Cell (SWATT Cell) for Highly Reliable Multi–Level NAND EEPROM's." IEEE Transactions on Electron Devices, vol. 44, No. 1. (Jan. 1997) : 145–152.

Gotou, H. "An Experimental Confirmation of Automatic Threshold Voltage Convergence in a Flash Memory Using Alternating Word–Line Voltage Pulses." IEEE Electron Device Letters, vol. 18, No. 10. (Oct. 1997) : 503–505.

Kim, H.S., et al. "Fast Parallel Programming of Multi–Level NAND Flash Memory Cells Using the Booster–Line Technology." 1997 Symposium on VLSI Technology Digest of Technical Papers. (1997) : 65–66.

Takeuchi, Ken, et al. "A Multi–Page Cell Architecture for High–Speed Programming Multi–Level NAND Flash Memories." 1997 Symposium on VLSI Circuits Digest of Technical Papers. (1997) : 67–68.

Choi, Jung Dal, et al. "A Triple Polysilicon Stacked Flash Memory Cell with Wordline Self–Boosting Programming." 1997 IEEE International Electron Devices Meeting. (1997) : 283–286.

Shen, Shih–Jye, et al. "Novel Self–Convergent Programming Scheme for Multi–Level P–Channel Flash Memory." 1997 IEEE International Electron Devices Meeting. (1997) : 287–290.

Otsuka, Nobuaki, and Horowitz, Mark A. "Circuit Techniques for 1.5–V Power Supply Flash Memory." IEEE Journal of Solid–State Circuits, vol. 32, No. 8. (Aug. 1997) : 1217–1230.

Hanyu, Takahiro, et al. "TP 2.5: 2–Transistor–Cell 4–Valued Universal–Literal CAM for a Cellular Logic Image Processor." (Feb. 1997) : 46–47 and 362.

Eitan, Boaz. "Hot Carrier Effects in FLASH." Microelectronic Engineering, vol. 36. (Jun. 1997) : 277–284.

Montanari, Donato, et al. "Voltage Variant Source Side Injection for Multilevel Charge Storage in Flash EEPROM." IEEE Transactions on Components, Packaging, and Manufacturing Technology, Part A. vol. 20, No. 2. (Jun. 1997) : 196–202.

Calligaro, Cristiano, et al. "Comparative Analysis of Sensing Schemes for Multilevel Non–Volatile Memories." 1997 Proceedings of the Second Annual IEEE International Conference on Innovative Systems in Silicon. (Oct. 1997) : 266–273.

Lorenzini, Martino, et al. "A Dual Gate Flash EEPROM Cell with Two–Bit Storage Capacity." IEEE Transactions on Components, Packaging and Manufacturing Technology, Part A. vol. 20, No. 2. (Jun. 1997) : 182–189.

Bonner, Bruce. "New Flash Market Attracts SGS and Mitsubishi." Dataquest, The Semiconductor DQ Monday Report, Issue 8. (Mar. 2, 1998). Dataquest Analysis provided only.

Donoghue, Bill, et al. "A 256K HCMOS ROM Using a Four–State Cell Approach." IEEE Journal of Solid–State Circuits, vol. SC–20, No. 2. (Apr. 1985) : 598–602.

*PRIOR ART READ*

MEMORY APPARATUS INCLUDING PROGRAMMABLE NON-VOLATILE MULTI-BIT MEMORY CELL, AND APPARATUS AND METHOD FOR DEMARCATING MEMORY STATES OF THE CELL

CROSS-REFERENCE TO RELATED APPLICATIONS

This is a division of application Ser. No. 10/742,890 filed Dec. 23, 2003, which is a division of Ser. No. 10/188,835 filed Jul. 5, 2002 now U.S. Pat. No. 6,714,455, which is a division of application Ser. No. 09/893,545 filed Jun. 29, 2001 now U.S. Pat. No. 6,434,050, which is a division of application Ser. No.09/733,937 filed Dec. 12, 2000 now U.S. Pat. No. 6,353,554, which is a continuation of application Ser. No. 09/493,139 filed Jan. 28, 2000 (abandoned), which is a division of application Ser. No. 09/411,315 filed Oct. 4, 1999 (now U.S. Pat. No. 6,246,613), which is a division of application Ser. No. 08/975,919 filed Nov. 21, 1997 (now U.S. Pat. No. 6,002,614), which is a continuation-in-part of application Ser. No. 08/410,200 filed Feb. 27, 1995 (now U.S. Pat. No. 5,764,571).

BACKGROUND OF THE INVENTION

1. Field of the Invention

This invention relates to non-volatile memory devices and is more particularly concerned with certain apparatus and methods based on new concepts of memory state demarcation and programming reference signal generation for multi-bit electrically alterable non-volatile memory (EANVM) cells.

2. Related Background Art

In conventional single-bit per cell memory devices, the memory cell assumes one of two information storage states, either an "on" state or an "off" state. This combination of either "on" or "off" defines one bit of information. A memory device using such single-bit cells to store n bits of data (n being an integer greater than 0) thus requires n separate memory cells.

Increasing the number of bits which can be stored in a single-bit per cell memory device involves increasing the number of memory cells on a one-for-one basis with the number of bits of data to be stored. Methods for increasing the number of memory cells in a single memory device have relied upon advanced manufacturing techniques that produce larger chips containing more memory cells or that produce smaller memory cells (e.g., by high resolution lithography) to allow more memory cells to be placed in a given area on a single chip.

An alternative to the single-bit per cell approach involves storing multiple bits of data in a single memory cell. Previous approaches to implementing multiple-bit per cell non-volatile memory devices have typically involved mask-programmable read only memories (ROMs). In one of these approaches, the channel width and/or length of the memory cell is varied such that $2^n$ different conductivity values are obtained which correspond to $2^n$ different states, whereby n bits of data can be stored by a single memory cell. In another approach, the ion implant for the threshold voltage is varied such that the memory cell will have $2^n$ different voltage thresholds (Vt) corresponding to $2^n$ different conductivity levels corresponding to $2^n$ different states, whereby n bits of data can be stored by a single memory cell. Examples of memory devices of these types are described in U.S. Pat. No. 4,192,014 to Craycraft, U.S. Pat. No. 4,586,163 to Koike, U.S. Pat. No. 4,287,570 to Stark, U.S. Pat. No. 4,327,424 to Wu, and U.S. Pat. No. 4,847,808 to Kobatake.

Electrically alterable non-volatile memory (EANVM) devices capable of storing multiple bits of data per cell are also known. In these devices, the multiple memory states of the cell are demarcated by predetermined reference signal levels that define boundaries between adjacent memory states. The memory cell is read out by comparing a signal from the cell with the reference signals to determine the relative levels of the cell signal and the reference signals. The comparison results indicate whether the cell signal level is above or below the respective memory state boundaries, and thus collectively indicate the programmed state of the cell corresponding to the stored data. The comparison results are encoded to reproduce the stored data and complete the cell readout operation. Generally speaking, the number of reference levels required to demarcate n memory states for storing n bits of data is $2^n-1$. The number may be greater if, for example, the uppermost or lowermost memory state is to be bounded on both sides.

Previous approaches to programming multi-bit EANVM cells are based on a repeated cycle of programming and readout of the cell. The cell is programmed incrementally, by the application of programming pulses, and the programmed status of the cell is checked repeatedly during the programming process by reading out the memory state of the cell as described above to verify the attained level of programming. Programming is continued until the target memory state has been reached, as indicated by the readout of the cell.

In order to minimize the possibility of readout errors, the programming level of a multi-bit EANVM cell should be set with a margin relative to the reference signal level or levels that demarcate the target memory state. The programming margin should be sufficient to avoid readout errors that might occur due to variations in operating characteristics of the cell with changing conditions such as temperature, system voltages, or mere passage of time. More particularly, if the cell is programmed too close to a memory state boundary, slight variations in the operating characteristics could shift the cell signal level relative to the state boundary level, resulting in an error upon subsequent readout of the cell.

Program margining is not particularly problematical in single-bit per cell memory devices, since there are only two memory states, and thus no intermediate memory states. Because it is impossible to overshoot the target state by overprogramming the cell, the cell may simply be programmed to set the cell signal level as far as possible from the reference level bounding the two memory states.

By contrast, the presence of one or more intermediate memory states makes program margining a significant concern in the case of multi-bit per cell devices, because an intermediate memory state requires a programming margin that provides adequate separation from two boundary levels—that is, the boundaries of the intermediate memory state with both the state above and the state below. Programming the cell too close to either level can result in a readout error. Also, both overprogramming and under programming must be avoided to prevent overshooting and undershooting the target intermediate state.

Previous program margining techniques include techniques that, for programming purposes, shift the cell signal level or the reference signal levels relative to their values during normal memory readout. The effect in either case is that, for a given programming amount of the cell, the cell will read differently during programming than during a normal readout operation. The difference corresponds to the shift amount of cell signal or the reference signals and provides a programming margin. Examples of these techniques are found in U.S. Pat. No. 5,172,338 to Mehrotra et al. and in Beliker et al., "A Four-State EEPROM Using Floating-Gate Memory Cells," *IEEE Journal of Solid State Circuits*, Vol. SC-22, No. 3, June 1987, pp. 460–463.

Another margining technique involves the provision of additional reference signals having levels intermediate those of the state-demarcating reference levels. The intermediate reference levels define program margin ranges in conjunction with the state-demarcating levels. After the cell reaches the target memory state, as indicated by comparison with the state-demarcating signals, programming is continued based on further comparison of the cell signal with one or more intermediate reference signals to provide a programming margin. An example of this technique is found in U.S. Pat. No. 4,964,079 to Devin.

In the above-described approaches to programming multi-bit per cell EANVM devices, the programming speed (total time to program a cell to a target state) is substantially limited by the need for repeated readout of the memory cell during the programming process. Also, the aforementioned program margining techniques impose substantial complications on the overall circuit design due to the need to shift the cell signal level or the state-demarcating reference signal levels, or to provide intermediate reference levels for establishing program margin ranges in conjunction with the state-demarcating reference signal levels. Furthermore, these margining techniques do not assure an optimum programming margin throughout variations in operating characteristics of the cell, because they do not precisely track such variations with changing conditions that affect the operating characteristics.

SUMMARY OF THE INVENTION

The predecessor applications underlying the present application disclose a completely different approach to multi-bit per cell EANVM programming (the approach is also described in detail herein). According to this approach, the programming control scheme uses a programming reference signal corresponding to the target memory state to program the memory cell, and does not require reading out the memory state of the cell during programming.

The invention claimed in the present application is based on new concepts of memory state demarcation and programming reference signal generation that can be applied with great advantage to the aforementioned approach. According to a first of these concepts, a plurality of programming reference signals (or signals set in substantial correspondence therewith) are used to generate the state-demarcating reference signals. This is done in such a manner that each programming reference signal (or correspondingly set signal) has a level unique to its corresponding memory state. As will be more fully appreciated from the detailed description that follows, by generating the state-demarcating reference signals in this manner, it becomes possible to program a multi-bit EANVM cell without reading out the cell's memory state during the programming operation, while at the same time providing effective program margining without the complexities associated with the previous margining techniques described above.

According to one of its broader aspects, the present invention thus provides an apparatus for demarcating memory states of an EANVM cell having more than two memory states. The apparatus comprises a reference signal generating circuit which generates a plurality of signals corresponding to memory states of the cell, each signal having a level unique to its corresponding memory state and substantially the same as a programming reference level for controlling programming of the cell to the corresponding memory state. The reference signal generating circuit uses the plurality of signals to generate reference signals having levels that constitute boundaries of memory states of the cell.

The invention also provides a programmable multi-level memory apparatus, which comprises an EANVM cell having more than two memory states, a programming circuit for programming the EANVM cell, and a reference signal generating circuit as described above.

According to another of its broader aspects, the present invention provides an apparatus for demarcating memory states of an EANVM cell having more than two memory states, the apparatus comprising a reference signal generating circuit which generates reference signals having levels that constitute boundaries of memory states of the cell. The reference signals are generated dependent upon a plurality of signal levels that are set in substantial correspondence with programming reference levels for controlling programming of the cell, with each programming reference level being unique to a different memory state of the cell.

The invention also provides a programmable multi-level memory apparatus, which comprises an EANVM cell having more than two memory states, a programming circuit for programming the cell, and a reference signal generating circuit as just described.

In a preferred mode of the invention, the plurality of signals used to generate state-bounding the reference signals are themselves generated by reference cells that substantially track changes in operating characteristics of the EANVM cell with changes in conditions that affect the operating characteristics. The reference cells may have substantially the same construction as the EANVM cell, and be manufactured concurrently with the EANVM cell, by the same fabrication process, as elements of the same integrated circuit with the EANVM cell. Thus, the signals that are used to generate the state-bounding reference signals can track changes in the operating characteristics of the EANVM cell with high accuracy. This makes it possible to maintain optimum programming margins throughout variations in operating characteristics of the EANVM cell.

Another new concept of the present invention relates to programming reference signal generation, and in particular the use of reference cells for this purpose. According to this concept, which may (but need not be) applied in conjunction with the first concept discussed above, the programming reference signals are generated by corresponding reference cells which substantially track changes in operating characteristics of the EANVM cell with changes in conditions that affect the characteristics. This assures a stable relationship between the cell signal level and the programming reference signal levels and leads to better programming consistency.

Thus, in accordance with yet another of its broader aspects, the present invention provides a programmable multi-level memory apparatus which comprises an EANVM cell having more than two memory states, a programming reference signal generating circuit, and a programming circuit. The programming reference signal generating circuit includes a plurality of reference cells which substantially track changes in operating characteristics in the EANVM cell with changes in conditions that affect the operating characteristics. The reference cells include a corresponding reference cell for each memory state, with each reference cell being programmed such that the programming reference signal generating circuit generates a programming reference signal having a level unique to the corresponding memory state. The programming circuit selectively programs the EANVM cell in accordance with the level of each programming reference cell.

Still further aspects of the invention relate to the methodology of demarcating memory states of a multi-level EANVM cell based on the principles discussed above.

The principles of the present invention, as well as its various aspects, features, and advantages, will be more fully appreciated from the following detailed description taken in conjunction with the accompanying drawings.

DETAILED DESCRIPTION OF THE INVENTION

The invention will now be described in detail in relation to several preferred embodiments illustrated in the accompanying drawings. Of course, it will be understood that the illustrative embodiments are merely exemplary and that the scope of the present invention, as defined in the appended claims, encompasses a wide range of alternatives, modifications and equivalents, which may be implemented consistent with the basic principles described herein.

Generally speaking, the invention described herein allows multiple bits of information to be efficiently and reliably stored in and read from an electrically alterable non-volatile memory (EANVM). In the preferred practice of the invention, this is accomplished by electrically varying the conductivity of the channel of a floating gate FET to be within any one of $K^n$ conductivity ranges, where "K" represents the base of the numbering system being employed (in a binary system, K=2) and n is the number of bits stored per cell ($n \geq 2$). The conductivity range is then sensed and encoded based on reference signal levels corresponding to boundaries of the conductivity ranges to read out the memory cell. The floating gate FET conductivity is electrically modified using programming hardware and algorithms which supply appropriate signals to the EANVM memory device in a program/verify control cycle which incrementally stores electrons on the floating gate until the desired conductivity level is achieved. For the purpose of illustration, the systems described herein will assume a binary system which stores 2-bits per memory cell.

I. Conventional Single-Bit EANVM Devices

Before considering the subject matter of the present invention in detail, it is appropriate, for purposes of perspective, to consider conventional single-bit per cell EANVM devices.

Figure 1:
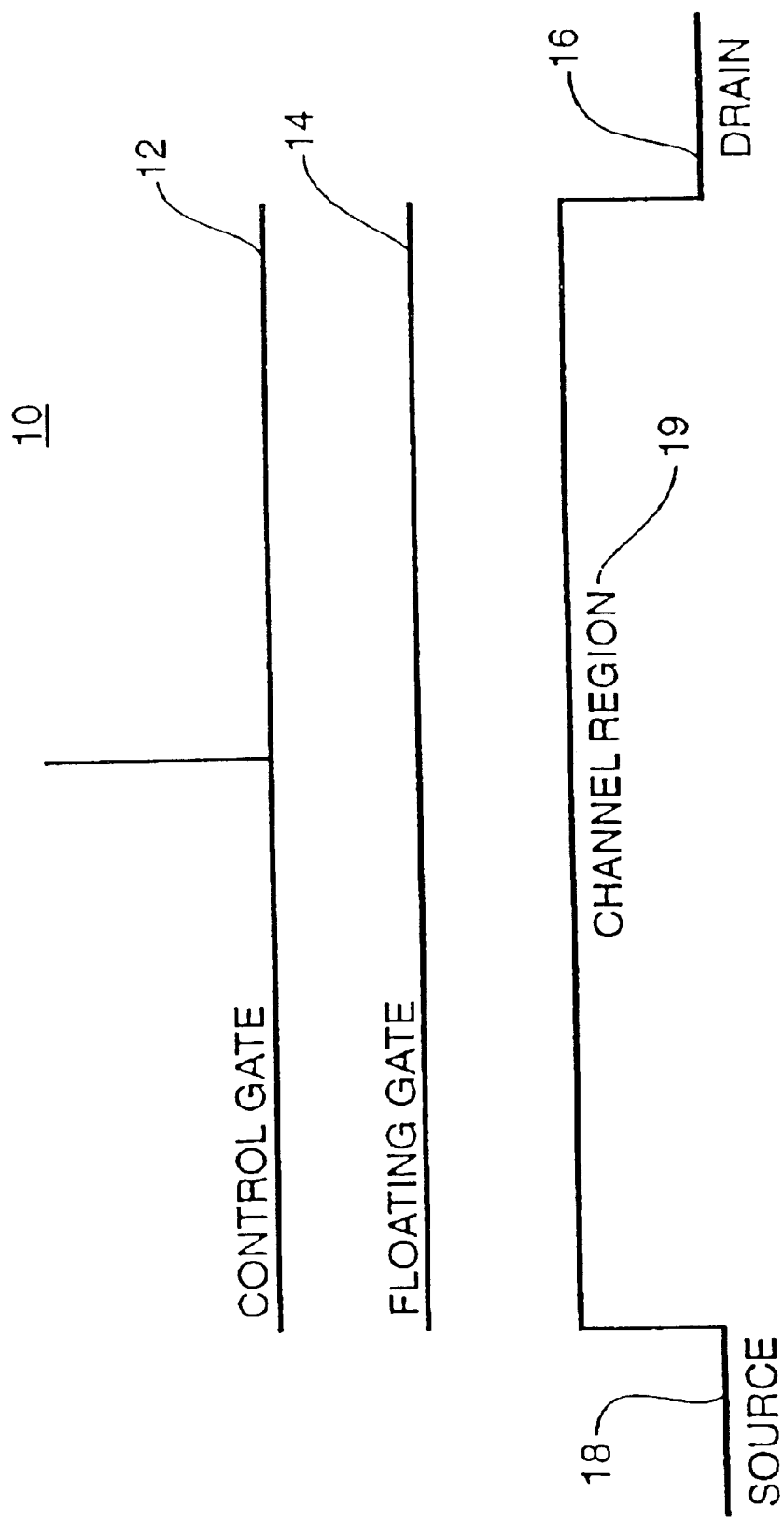
FIG. 1 is a generic schematic representation of a non-volatile floating gate memory cell.

FIG. 1 is a generic schematic representation of a non-volatile floating gate FET memory cell 10.

The FET memory cell 10 includes a control gate 12 which is used either to select the memory cell for reading or is used to cause electrons to be injected onto a floating gate 14 during the programming process. Floating gate 14 is an electrically isolated structure which can indefinitely store electrons. A drain region 16 of the FET is coupled to a source region 18 by a channel region 19. The presence or absence of electrons on floating gate 14 alters the voltage threshold of the memory cell 10 and, as a result, alters the conductivity of its channel region. When the floating gate 14 is fully erased and the control gate 12 has been selected, the channel region 19 is in the fully "on", or high conductivity, state. When the floating gate 14 is fully programmed, the channel region 19 is in the fully "off", or low conductivity, state.

Figure 2:
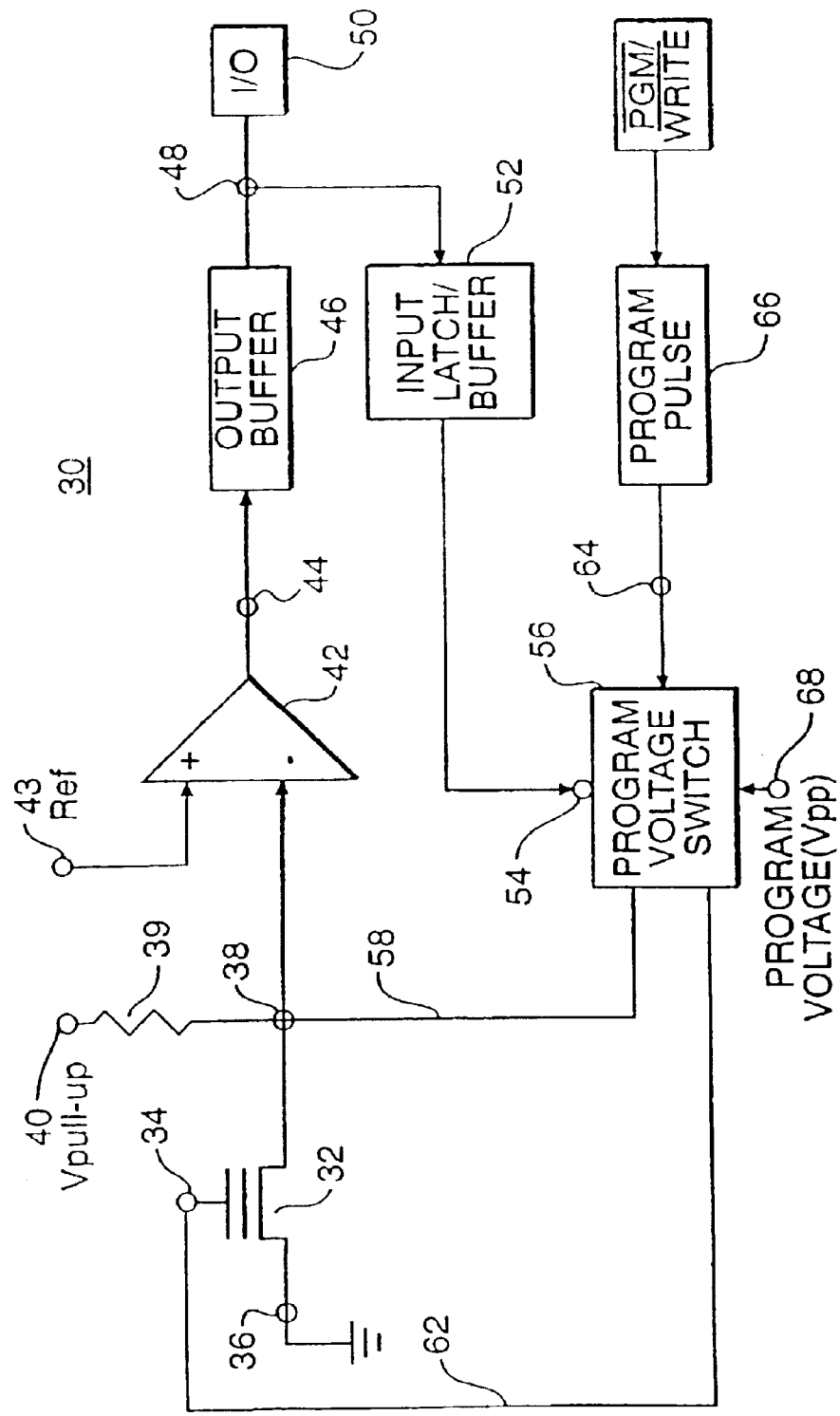
FIG. 2 is a block diagram of a prior art single-bit memory system.

FIG. 2 is a block diagram of a conventional single-bit EANVM memory system 30. The memory system 30 stores a single bit of information in an EANVM cell (FET) 32. The cell 32, which has the same construction as FET 10 in FIG. 1, is selected for reading or writing when a row, or word, select signal is applied to a control gate terminal 34. A source terminal 36 for the cell 32 is connected to a reference ground potential. A drain terminal 38 is connected through a pull-up device (resistor) 39 to a voltage Vpull-up at a terminal 40. Terminal 38 serves as the output terminal of the cell 32. When the cell 32 stores a "0" bit, the channel of the FET is in a low conductivity, or high impedance, state so that the voltage at terminal 38 is pulled up to the voltage level Vpull-up on terminal 40. When the cell 32 stores a "1" bit, the channel of the FET is in a high conductivity, or low impedance, state so that the voltage at terminal 38 is pulled-down by the ground potential at terminal 36.

For reading the value of the single bit stored in the cell 32, a sense amplifier 42 compares the voltage at terminal 38 with a reference voltage Ref at terminal 43. If a "0" is stored on the EANVM cell 32, the cell is in a low conductivity state and, as a result, the voltage at terminal 38 is above the reference voltage at terminal 43. The output terminal 44 of the sense amplifier 42 will be at a low voltage, which will be transmitted through an output buffer 46 to a terminal 48 and then coupled to an I/O terminal 50 as a logical "0". If a "1" is stored in the EANVM cell 32, the cell is in a high conductivity state and, as a result, the voltage at terminal 38 is below the reference voltage at terminal 43. The output of the sense amplifier 42 will be a high voltage which will be transmitted to the I/O terminal 50 as a logical "1".

For writing the value of an information bit in the cell 32, it is assumed that the cell 32 is initially in the erased or fully "on" state, which corresponds to a logical "1". The I/O terminal 50 is connected to the input terminal of an input latch/buffer 52. The output of the input latch/buffer 52 is connected to an enable/disable terminal 54 of a program voltage switch 56. The program voltage switch 56 provides a bit-line program voltage on a signal line 58 connected to terminal 38. Another output from the program voltage switch 56 is the word line program voltage on a signal line 62, which is connected to the control gate terminal 34 of the EANVM cell 32. When a logical "0" is present at terminal 54 of the program voltage switch 56 from the output of input latch/buffer 52 and the program voltage switch 56 is activated by a program pulse on a signal line 64 from a program pulse generator 66, activated by a PGM/Write (Program/Write) signal, the program voltage switch 56 provides the program voltage Vpp (typically 12 volts) from a terminal 68 to the control gate terminal 34 of the EANVM cell 32 via signal line 62. The program voltage switch 56 also biases the drain of the EANVM cell 32 to a voltage somewhat less that Vpp, typically about 8 to 9 volts. Under these conditions, electrons are injected into the floating gate by a phenomenon known as hot electron injection. This programming procedure raises the voltage threshold of the EANVM cell, which increases its source-drain impedance. This continues until the FET memory cell 32 is effectively turned off, which corresponds to a "0" state. When a "1" is present on terminal 54 from the output of the input latch/buffer 52 and the PGM/Write signal is enabled, the signal line 58 is driven low and programming is inhibited so that the "1" or erased state is maintained.

Figure 3:
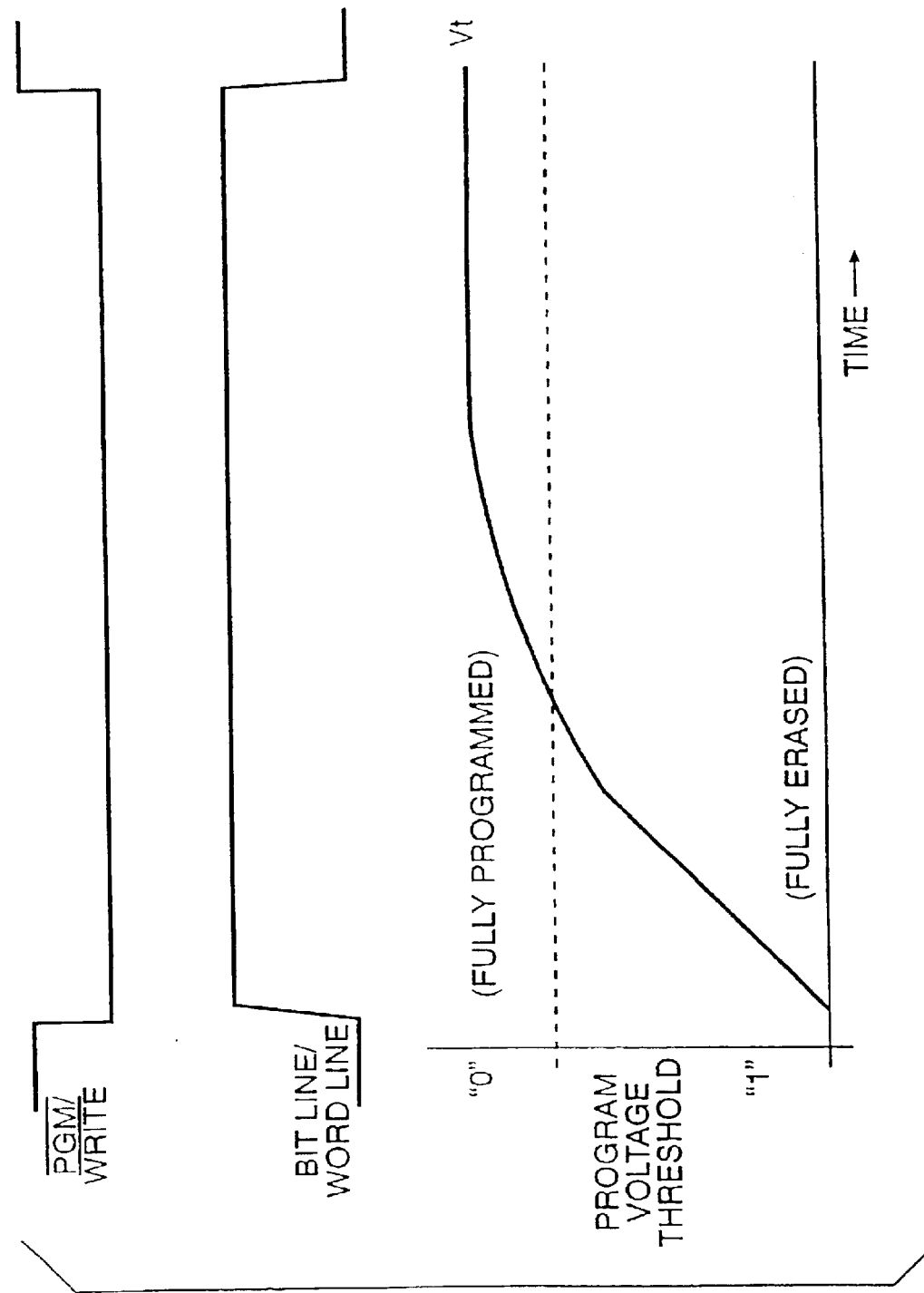
FIG. 3 is a timing diagram of the voltage threshold of a prior art single-bit per cell EANVM system being programmed from an erased "1" state to a programmed "0" state.

FIG. 3 is a timing diagram showing the change in voltage threshold of the EANVM cell 32 under control of the word line and bit line programming voltages as the memory cell is being programmed from the fully erased "1" state to the fully programmed "0" state. For simplicity, the word line and bit line programming voltages, which are controlled by the PGM/Write signal, are shown as a single pulse. For the duration of the PGM/Write pulse, the bit and word line program voltages are respectively applied to the drain of the memory cell 32 via the bit line terminal 38 and to the control gate via the control gate terminal 34 of the memory cell 32. As electrons are injected onto the floating gate, the voltage threshold of the memory cell begins to increase. Once the voltage threshold has been increased beyond a specific threshold value indicated by the dashed horizontal line, the memory cell 32 is programmed to a "0" state.

Fowler-Nordheim tunneling can also be used instead of hot electron injection to place electrons on the floating gate. The multi-bit EANVM device described herein functions with either memory cell programming technique. The conventional programming algorithms and circuits for either type of programming are designed to program a single-bit cell with as much margin as possible in as short a time as possible. For a single-bit memory cell, margin is defined as the additional voltage threshold needed to insure that the programmed cell will retain its stored value over time.

Figure 4:
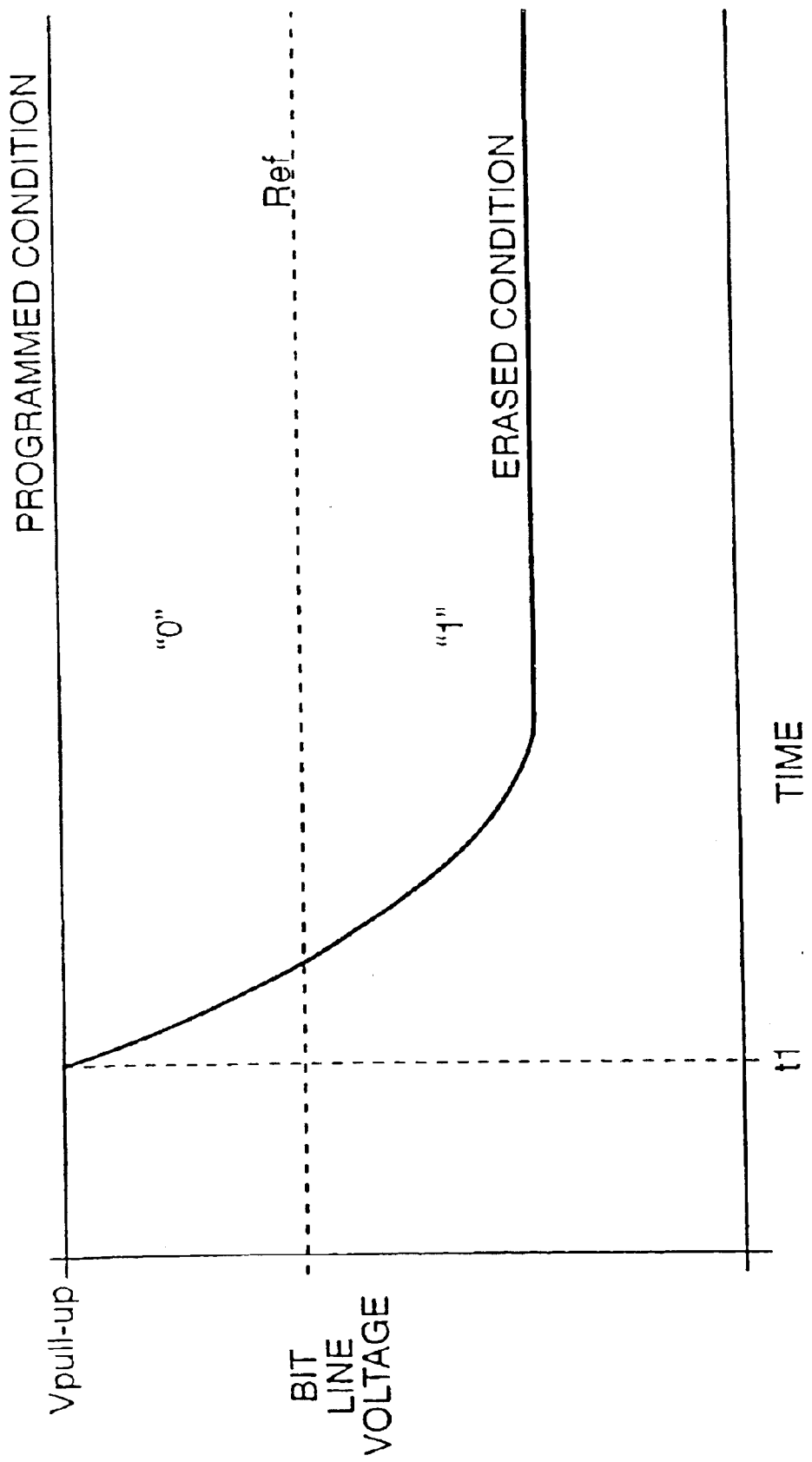
FIG. 4 is a timing diagram of the bit line voltage of a prior single-bit per cell EANVM during a read operation. It illustrates VOLTAGE signals for both the programmed and erased conditions.

FIG. 4 is a timing diagram showing the bit line voltage at terminal 38 as a function of time during a memory read operation. In this example, prior to time t1 the bit line is charged to the Vpull-up condition. Note that it is also possible that the bit line may start at any other voltage level prior to time t1. At time t1, the EANVM cell 32 is selected and, if the cell 32 is in the erased or "1" state, the cell 32 provides a low impedance path to ground. As a result, the bit line is pulled-down to near the ground potential provided at terminal 36 in FIG. 2. If the EANVM cell 32 were in the "0" or fully programmed state, the bit line voltage would remain at the Vpull-up voltage after time t1. The voltage on the bit-line terminal 38 and the reference voltage Ref at terminal 43 are compared by the sense amplifier 42, whose buffered output drives I/O terminal 50. When the reference voltage is greater than the bit line voltage, the output on I/O terminal 50 is a logical "1". When the reference voltage is lower than the bit line voltage, the output on I/O terminal 50 is a logical "0".

II. Memory Array for a Multi-Bit EANVM System

Figure 5:
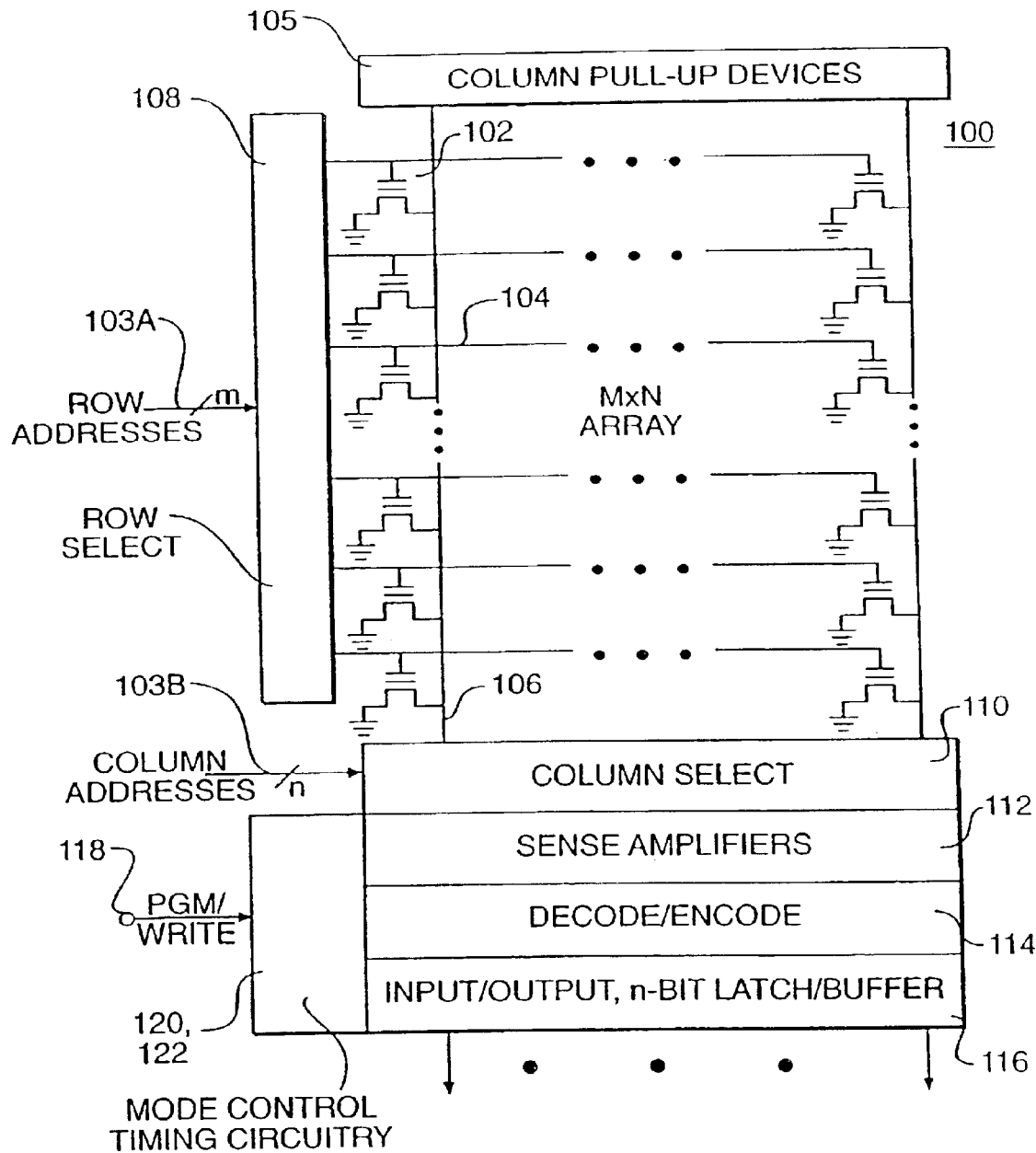
FIG. 5 is a block diagram of an M×N memory array implementing a multi-bit per cell EANVM system.

FIG. 5 is a block diagram of a multi-bit per cell EANVM system 100 in accordance with the present invention, which includes an M×N array of EANVM cells. The cells are shown as floating gate FET cells 102, having the same construction as described in connection with FIG. 1. The general arrangement of the system is similar to that used for conventional single-bit per cell memory devices, although on a detailed level there are significant differences related to the multi-bit per cell implementation as will be apparent later.

Each cell 102 in FIG. 5 belongs to a row and a column of the array and has its source connected to a ground reference potential and its drain connected to a corresponding column bit line 106. The column bit lines are connected to corresponding pull-up devices indicated collectively by the block 105. All control gates of a row of cells are connected to a corresponding row select, or word, line 104. Rows are selected with a row select circuit 108 and columns are selected with a column select circuit 110 in the usual manner. Row and column address signals are provided over corresponding address busses 103A and 103B. Sense amplifiers 112 are provided for each of the columns of the array. Decode/encode circuits 114 and n-bit input/output latches/buffers 116 are also provided (n=2 for a 2-bit per cell system). A PGM/Write signal is provided at an input terminal 118 for activating a mode control circuit 120 and a timing circuit 122.

A significant advantage of this multi-bit per cell system 100 as compared to a single-bit per cell implementation is that the memory density is increased by a factor of n, where n is the number of bits which can be stored in an individual multi-bit memory cell.

III. Basic Read Mode/Circuitry for Multi-Bit Memory Cell

Figure 6:
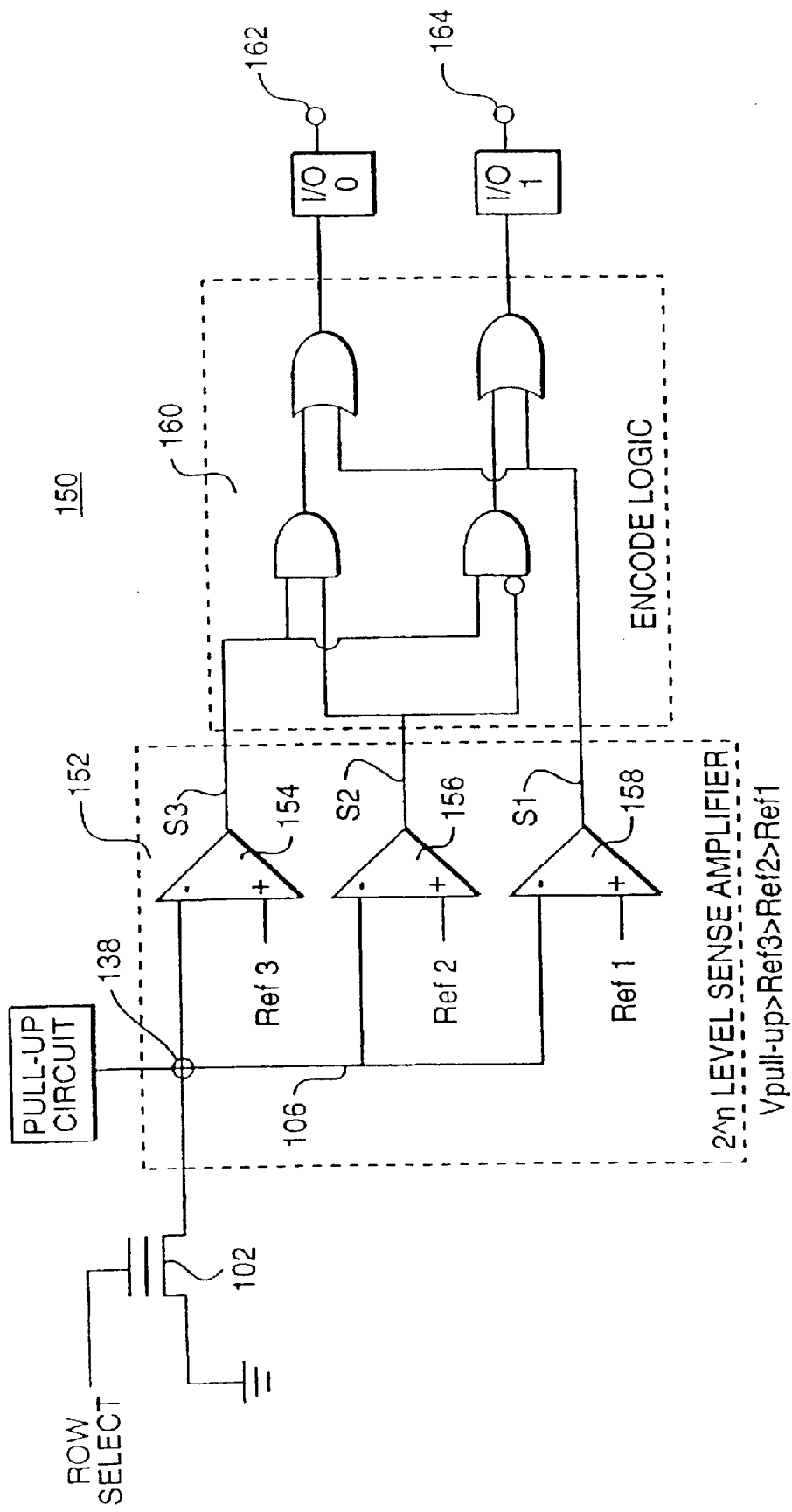
FIG. 6 is a block diagram of a circuit for reading a multi-bit EANVM cell.

FIG. 6 shows a binary system 150 for reading the state of multi-bit floating gate memory cell 102. For this example, the number of bits per cell (n) is assumed to be 2, so that one of four states of the memory cell must be detected, the four possible states being (0,0), (0,1), (1,0), and (1,1). To detect which state is programmed, a 4-level sense amplifier 152 is provided. This amplifier includes three sense amplifiers 154, 156, and 158, each of which has its negative input terminal connected to the output terminal 138 of the memory cell 102. Sense amplifier 154 has a reference voltage Ref3 connected to its positive input terminal, sense amplifier 156 has a reference voltage Ref2 connected to its positive input terminal, and sense amplifier 158 has a reference voltage Ref1 connected to its positive input terminal. These reference voltages demarcate the four memory states of the cell 102 and are set so as to satisfy the relationship Vpull-up >Ref3 >Ref2 >Ref1 (preferred techniques for generating these reference voltages will be described later). The respective output signals S3, S2, S1 of the three sense amplifiers drive an encode logic circuit 160, which encodes the sensed signals S3, S2, S1 into an appropriate 2-bit data format. Bit 0 is provided at an I/O terminal 162, and Bit 1 is provided at an I/O terminal 164. A truth table for the encode logic circuit 160 is as follows:

| S3 | S2 | S1 | I/O 1 | I/O 0 | State |
|----|----|----|-------|-------|-------|
| L  | L  | L  | 0     | 0     | (0, 0) |
| H  | L  | L  | 1     | 0     | (1, 0) |
| H  | H  | L  | 0     | 1     | (0, 1) |
| H  | H  | H  | 1     | 1     | (1, 1) |

During a read operation of the multi-bit memory cell 102, the levels of the respective output signals S3, S2, S1 of the sense amplifiers 154, 156, 158 are determined by the conductivity value to which the memory cell has been set during a programming operation (to be described later). When fully erased, EANVM cell 102 will be in its lowest threshold voltage state—that is, the highest conductivity state. Consequently, all of the reference voltages will be higher than the bit line voltage at terminal 138, indicating a (1,1) state. When fully programmed, EANVM cell 102 will be in its highest threshold voltage state, that is, its lowest conductivity state. Consequently, all reference voltages will be lower than the bit line voltage at terminal 138, indicating a (0,0) state. The intermediate threshold states are encoded as illustrated in the previous truth table for the logic circuit 160.

Figure 7:
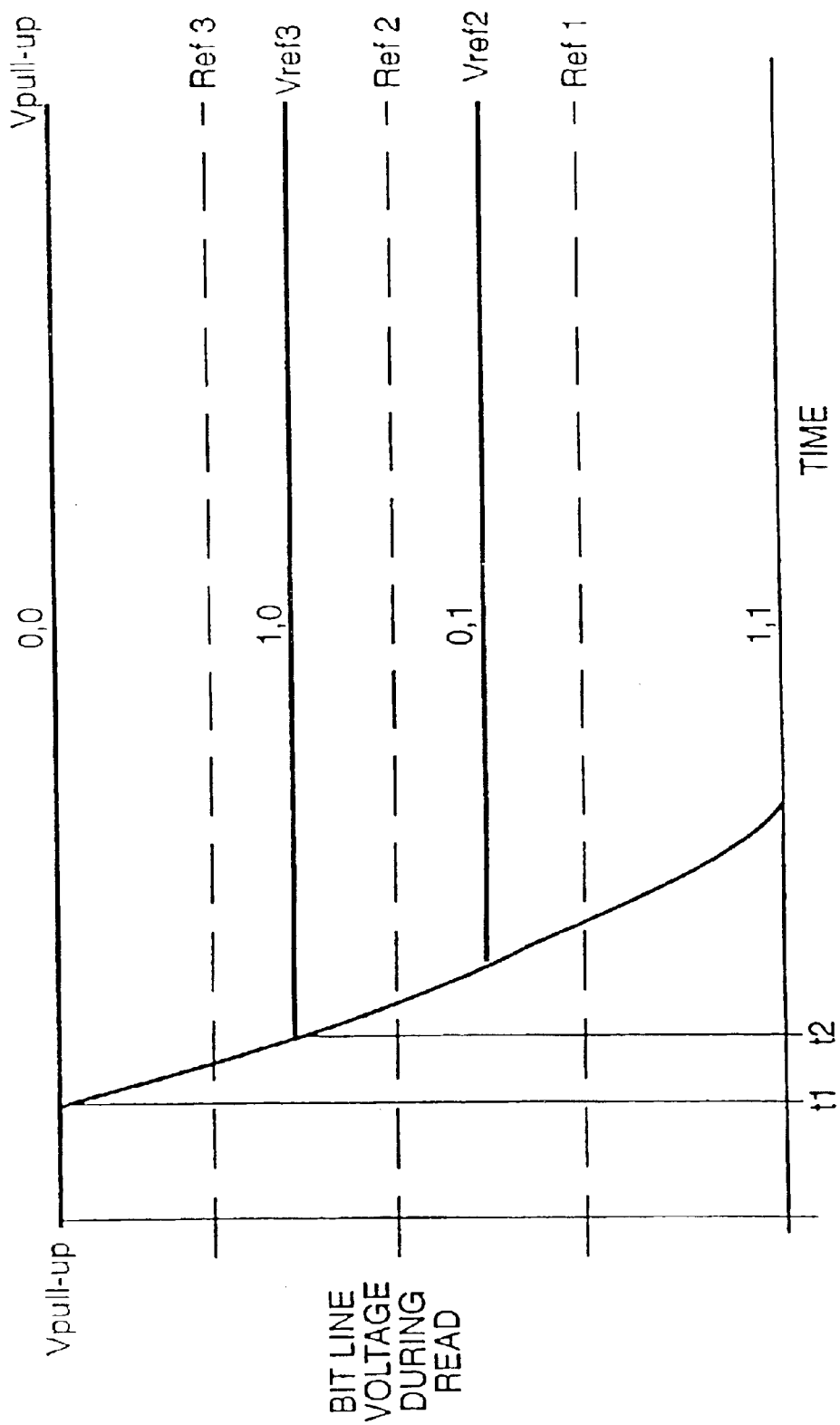
FIG. 7 shows the bit line voltage as a function of time during a read cycle for a 2-bit per cell EANVM which has been programmed to one of four possible states, (0,0), (1,0), (0,1) and a fully erased condition (1,1). Four separate voltage levels are represented in this figure, each representing one of the four possible states. Only one of these would be present for any given read operation.

FIG. 7 shows the bit line voltage at terminal 138 as a function of time during a read cycle for the memory cell 102. For purposes of illustration, each of the four possible voltage signals corresponding to the four possible programmed states of the memory cell are shown. During a read cycle, only the signal corresponding to the actual programmed state of the EANVM cell would occur. For example, assume the EANVM memory cell 102 has been programmed to a (1,0) state. Prior to time t1, because the EANVM cell 102 has not yet been selected or activated, the bit line 106 is pulled up to Vpull-up. At time t1, the EANVM cell is selected using standard memory address decoding techniques. Because the EANVM cell has been programmed to a specific conductivity level by the charge on the floating gate, the bit line is pulled down to a specific voltage level corresponding to the amount of current that the cell can sink at this specific conductivity level. When this point is reached at time t2, the bit line voltage stabilizes at a voltage level Vref3 between reference voltages Ref 3 and Ref 2 which bound the (1,0) state. When the EANVM cell 102 is de-selected, the bit line voltage will return to its pulled-up condition. Similarly, the bit-line voltage stabilizes at Vref2 for the (0,1) state or at 0 volts for the (1,1) state.

IV. Program and Read Circuitry for Multi-Bit EANVM Cell

Figure 8:
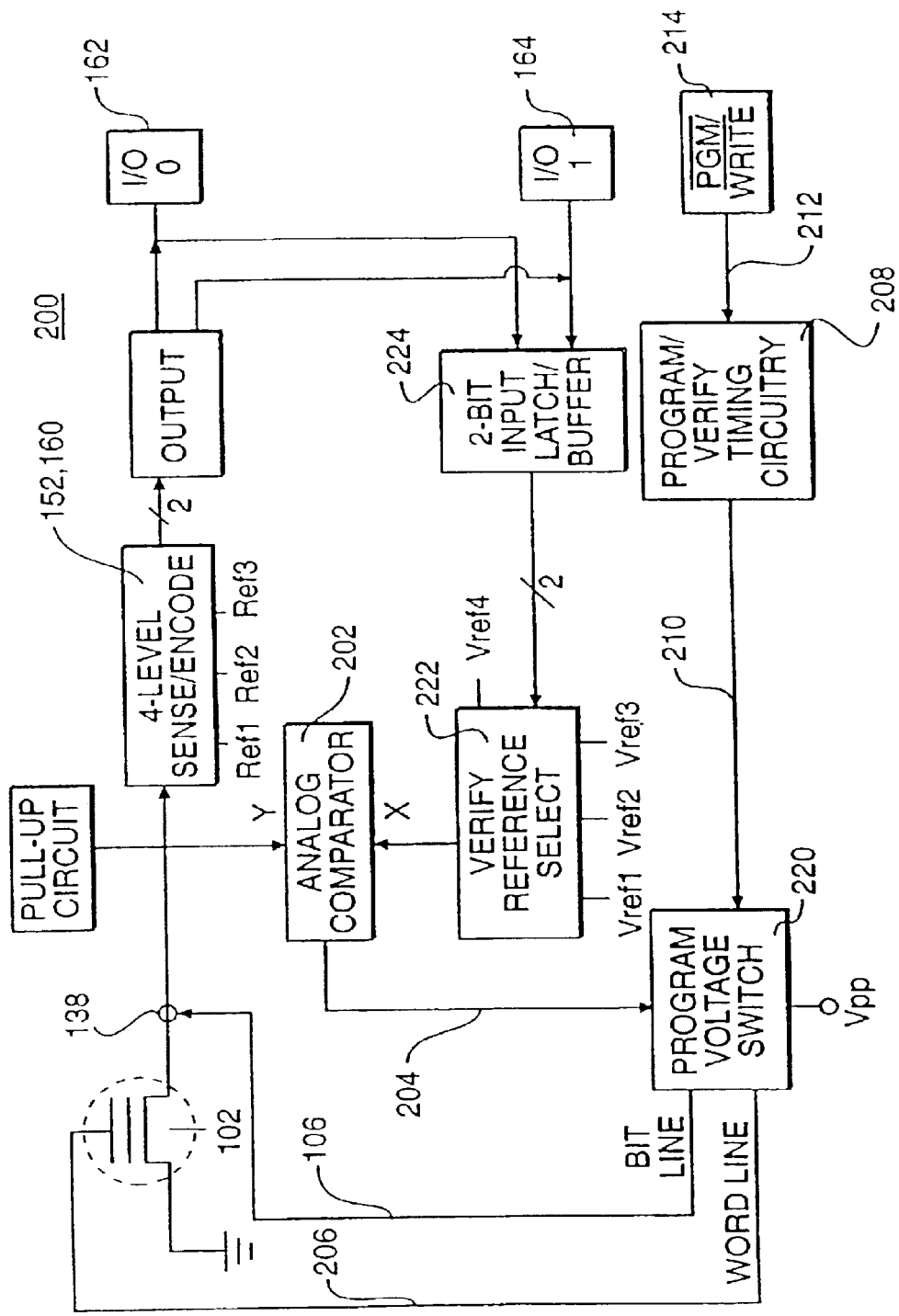
FIG. 8 is a block diagram of a multi-bit per cell system combining program/verify and read circuitry.

FIG. 8 is a block diagram of circuitry 200 for programming and reading memory cell 102. Although a binary 2-bit per cell system is shown for purposes of illustration, it is to be understood that the principles of the invention are similarly applicable to any system where the EANVM cell has more than two states. For example, in a non-binary system, the memory states can be three or some other multiple of a non-binary base.

The system 200 includes a memory cell 102 with a bit line output terminal 138. For the read mode of operation, the 4-level sense amplifier 152, supplied with read reference voltages Ref1, Ref2, and Ref3, and the encoder 160 are provided. Read data is provided at the Bit 0 I/O terminal 162 and at the Bit 1 I/O terminal 164.

For the write mode of operation, a verify reference select circuit 222 provides an analog programming voltage reference level signal X to one input terminal of an analog comparator 202. The programming reference voltages are chosen so that as soon as the bit line voltage on bit line 106 has reached the programming reference voltage level corresponding to a target memory state, the EANVM cell 102 is set to a proper threshold corresponding to the target memory state. The programming reference voltages Vref1, Vref2, Vref3, and Vref4 are set such that Vref4 is above Ref3, Vref3 is between Ref3 and Ref2, Vref2 is between Ref1 and Ref2, and Vref1 is below Ref1. During a normal read operation of either intermediate memory state, the bit line voltage will thus settle substantially midway between the read reference voltages demarcating the intermediate state to insure that the memory contents will be read accurately.

The verify reference select circuit 222 is controlled by the two output bits from a 2-bit input latch/buffer circuit 224, which receives binary input bits from the I/O terminals 162 and 164. The Y signal input terminal of the analog comparator 202 is connected to the bit line output terminal 138 of the multi-level memory cell 102. The output signal from the analog comparator is provided on a signal line 204 as an enable/disable signal for a program voltage switch 220.

An output signal line 206 from the program voltage switch 220 provides the word line program voltage to the control gate of the EANVM cell 102. Another output signal line 106 provides the bit line programming voltage to the bit line terminal 138 of EANVM cell 102.

After the program/verify timing circuit 208 is enabled by a PGM/Write signal provided on signal line 212 from a PGM/Write terminal 214, the timing circuit 208 provides a series of program/verify timing pulses to the program voltage switch 220 on a signal line 210. The pulse widths are set to control the programming process so that the voltage threshold of the EANVM cell 102 is incrementally altered by controlling the injection of charge onto the floating gate of the EANVM cell. Each programming cycle changes the voltage threshold and, as a result, the conductivity of the memory cell 102. After each internal program cycle is complete, as indicated by signal line 210 going "high", the program voltages provided by the program voltage switch 220 are removed, and a verify cycle begins. The voltage threshold of memory cell 102 is then determined by using the comparator 202 to compare the bit line voltage at terminal 138 with the selected programming reference voltage from the verify reference select circuit 222. When the bit line voltage has reached the level of the programming reference voltage supplied by the verify reference select circuit 222, the output signal from the comparator on line 204 will disable the program voltage switch 220, ending the programming cycle.

For this embodiment of the invention, during a write operation, comparison of the current memory cell analog contents with the analog information to be programmed on the memory cell 102 is performed by the analog comparator 202. The verify reference select circuit 222 analog output voltage X is determined by decoding the output of the 2-bit input latch/buffer 224. The Y input signal to the analog comparator 202 is taken directly from the bit line terminal 138. Note that the 4-level sense/encode circuits 152, 160, and verify reference select circuit 222 may be completely independent, as indicated in the drawing. Alternatively, they may be coupled together to alternately time share common circuit components. This is possible because the 4-level sense/encode circuits 152 and 160 are used in the read mode of operation while the verify reference select circuit 222 is used only in the write/verify mode of operation.

V. Basic Write Mode for Multi-Bit EANVM Cell

In the write mode, a binary multi-bit per cell EANVM system must be capable of electrically programming a memory cell to provide $2^n$ uniquely different threshold levels (n=the number of bits per cell). In the two-bit per cell implementation, if it is assumed that the cell starts from the erased (1,1) state, it is only necessary to program to three different thresholds which correspond to the three non-erased states. A first such threshold is determined so that, in the read mode, the bit line voltage will fall between Ref1 and Ref2. Another such threshold is determined so that, in the read mode, the bit line voltage will fall between Ref2 and Ref3. The third such threshold is determined so that, in the read mode, the bit line voltage will be greater than Ref3.

Figure 9:
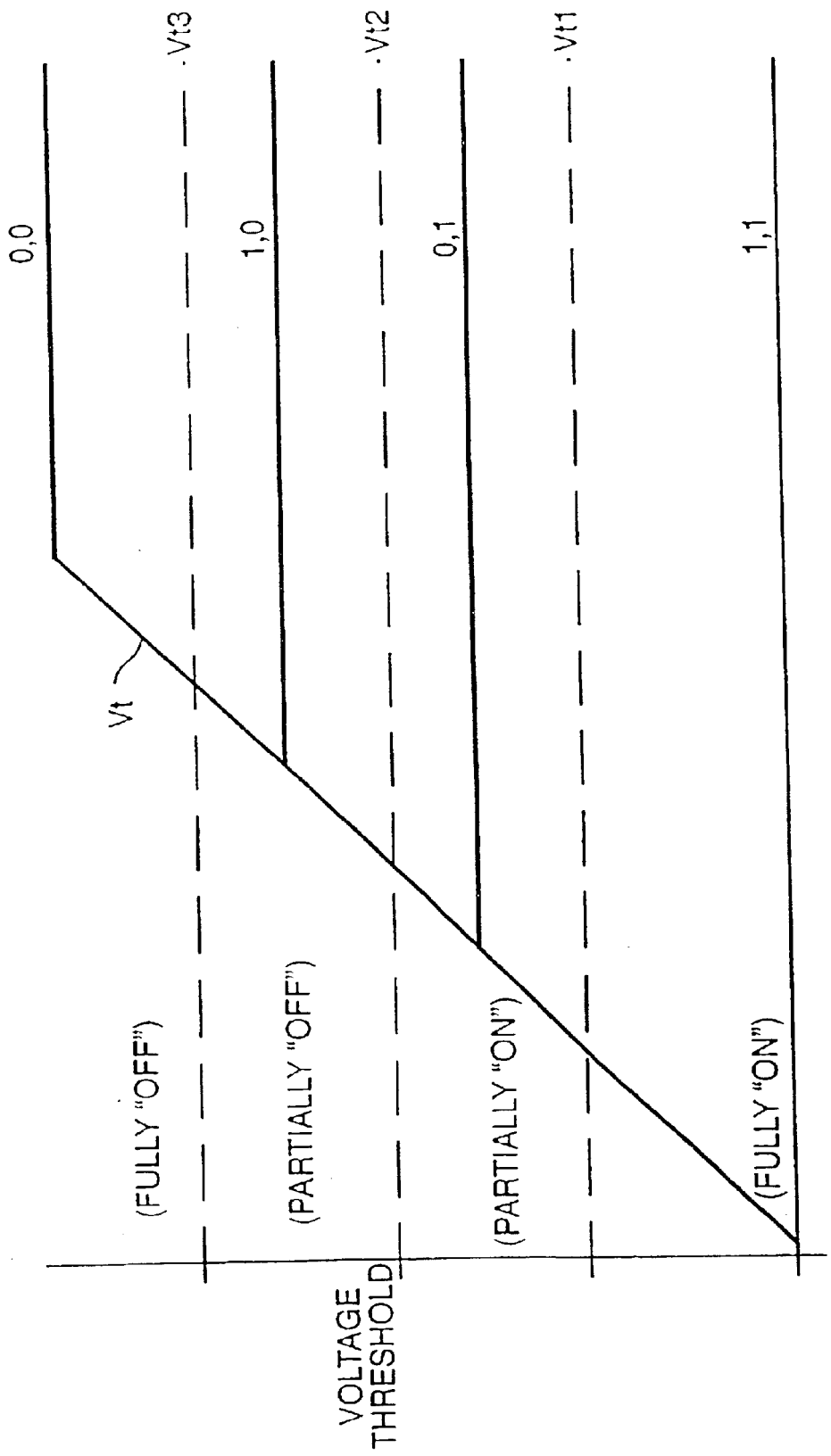
FIG. 9 is a timing diagram for the voltage threshold of a 2-bit EANVM cell being programmed from a fully erased (1,1) state to one of the other three possible states.

FIG. 9 illustrates the change in voltage threshold of a 4-level, or 2-bit, EANVM cell as the floating gate is being charged from an erased (1,1) threshold state to any one of the three other possible states (the charging being shown as continuous for simplicity). Vt1, Vt2, and Vt3 in FIG. 9 are thresholds corresponding to the read reference levels Ref1, Ref2, and Ref3, respectively. The plots labeled (0,1), (1,0), and (0,0) correspond to the programming thresholds for those states, which are the three non-erased states. In prior art single-bit memory cells where there are only two states, the design objective is to provide enough charge to the floating gate to insure that the cell's voltage threshold is programmed as high as possible, as shown in FIG. 3. Because there is no upper threshold limit in a single-bit per cell system, overprogramming the cell will not cause incorrect data to be stored on the memory cell.

As will be appreciated from FIG. 9, in a multi-bit per cell system, the memory cell must be charged to a point so that the voltage threshold is within a specific voltage threshold range. For example, where the cell is being programmed to a (1,0) state, the proper threshold range is defined as being above a threshold level Vt2 and as being below a threshold level Vt3. To accomplish this multi-level programming, the prior art EANVM circuitry is modified to the arrangement shown in FIG. 8. The comparator in FIG. 8, incidentally, is preferably analog as shown. However, a digital comparator could be used.

Figure 10:
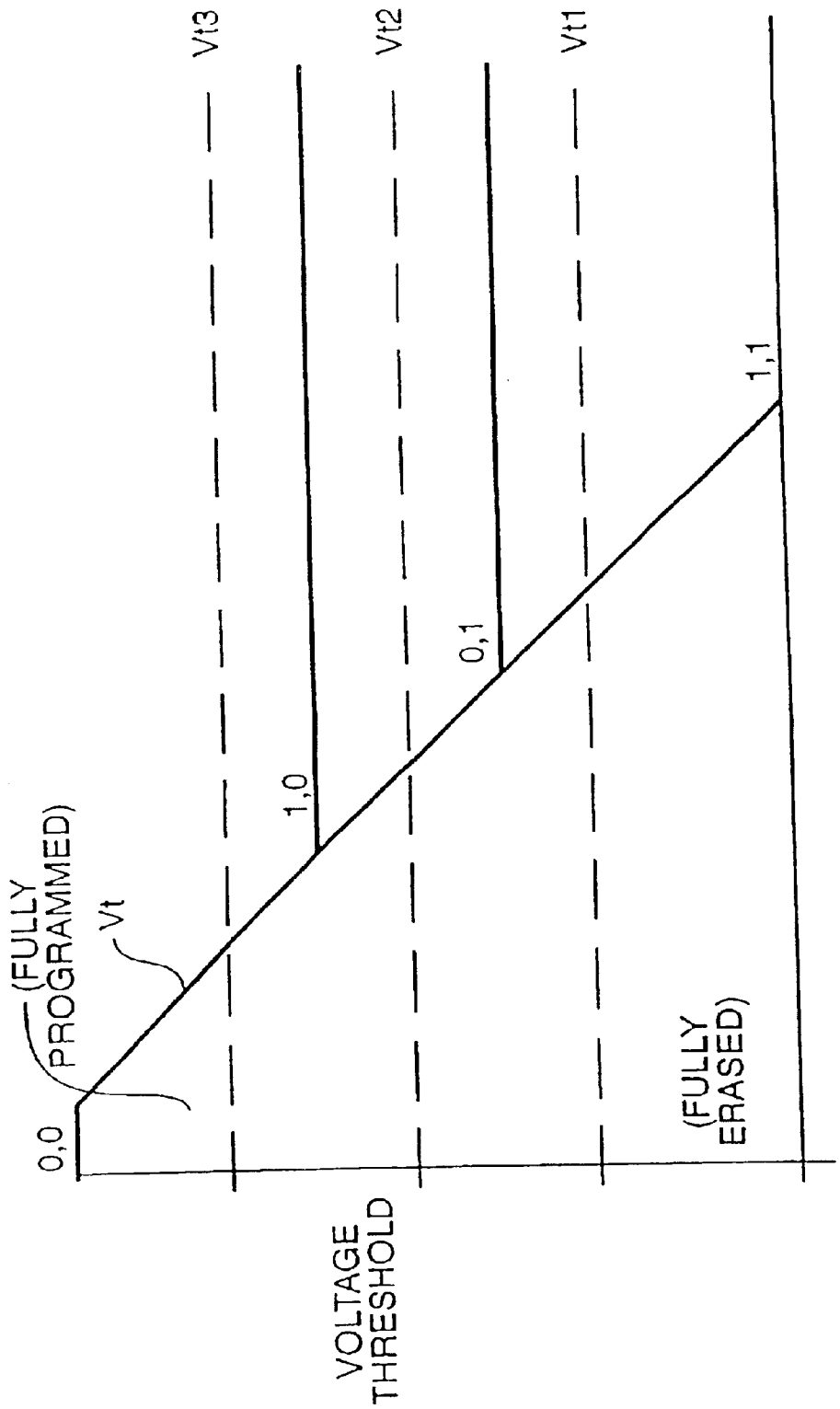
FIG. 10 is a timing diagram which illustrates the voltage threshold of a 2-bit EANVM cell being erased from a fully programmed (0,0) state to one of the other three possible states.

FIG. 10 illustrates the voltage threshold of a 4-level, or 2-bit, EANVM cell as the floating gate is being erased from a (0,0) state (the erasing being shown as continuous for simplicity). The EANVM programming operating procedure may call for a memory cell to be erased prior to being programmed. This erasure can be performed at the byte, block, or chip level and can be performed by electrical, UV, or other means. In this type of system, the cell would be completely erased to a (1,1) state prior to initiating a programming cycle. If a system has the capability to erase an individual memory cell, then it is not necessary to erase all of the cells of a group prior to initiating a programming operation. It is then possible to incrementally erase an individual memory cell as necessary to program the cell to the appropriate one of the voltage thresholds indicated by the plots labeled (1,0), (0,1), and (1,1).

Figure 11:
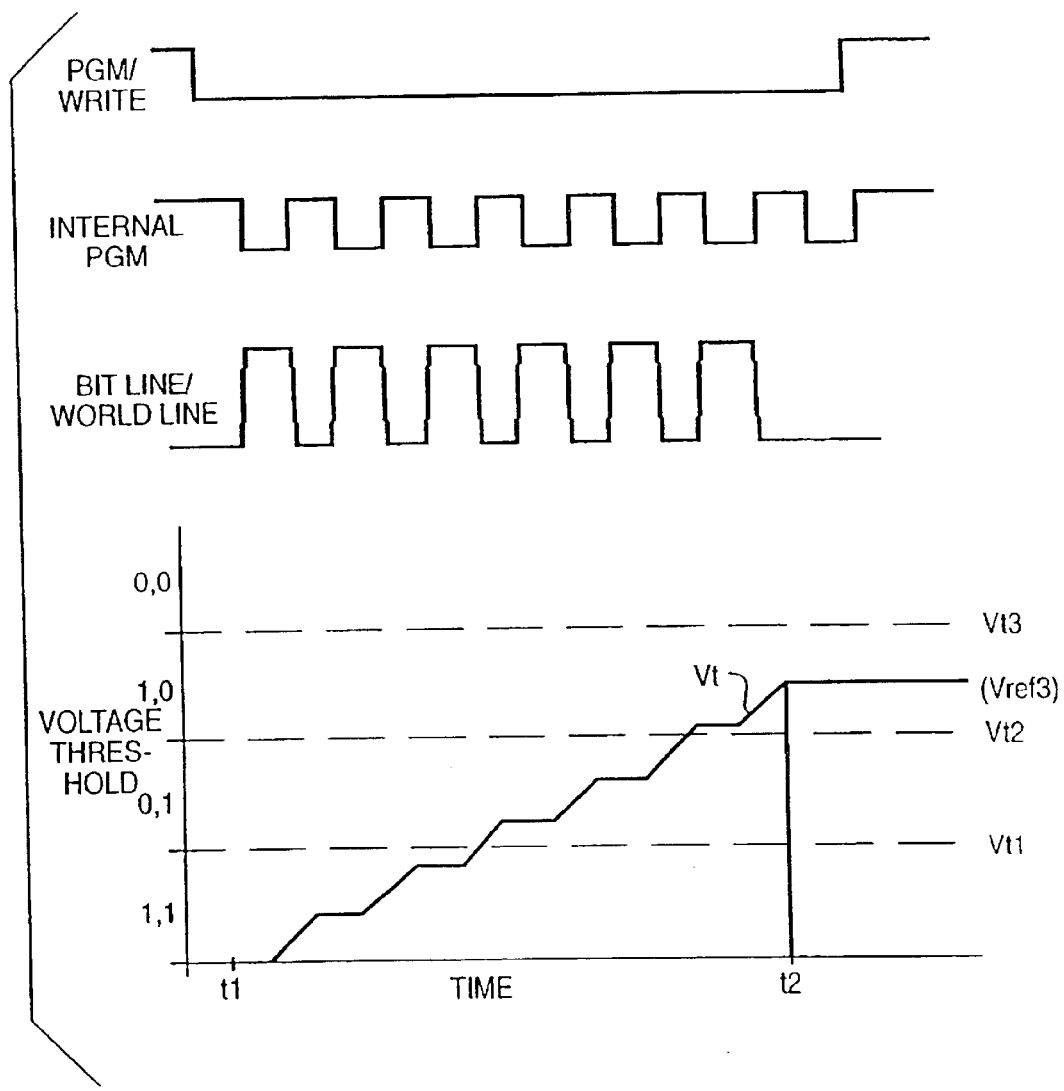
FIG. 11 is a timing diagram illustrating the voltage threshold of a 2-bit EANVM cell during a program/verify cycle using fixed width program pulses.

FIG. 11 is a voltage threshold timing diagram which illustrates how the system of FIG. 8 programs the 2-bit EANVM cell 102 from an erased (1,1) state to a (1,0) state using the timing circuitry 208 to generate fixed-width timing pulses. A low logic level state of the PGM/Write signal on signal line 212 enables the timing circuit 208. After being enabled at time t1, the timing circuit 208 provides an internal fixed-width low-level internal PGM timing pulse on signal line 210 to the program voltage switch 220. This pulse is output following an initial verify cycle which will be discussed in connection with FIG. 12. For the duration of the low state of the internal PGM timing pulse, the bit line and word line program voltage outputs on lines 106 and 206 will be raised to their respective programming voltage levels as indicated in FIG. 11. During this programming process, charge is added to the floating gate of the memory cell 102. When the internal PGM timing pulse from timing circuitry 208 switches to a high level, the programming voltages are removed and a verify cycle begins. For this example, verify reference voltage Vref3 is compared with the bit line voltage. This internally controlled program/verify cycle repeats itself until the bit line voltage on terminal 138 has reached Vref3. At this time, t2, the EANVM cell 102 is verified to have been programmed to a (1,0) state, and programming is halted by the comparator 222 providing a disable signal on signal line 204 to the program voltage switch 220.

Figure 12:
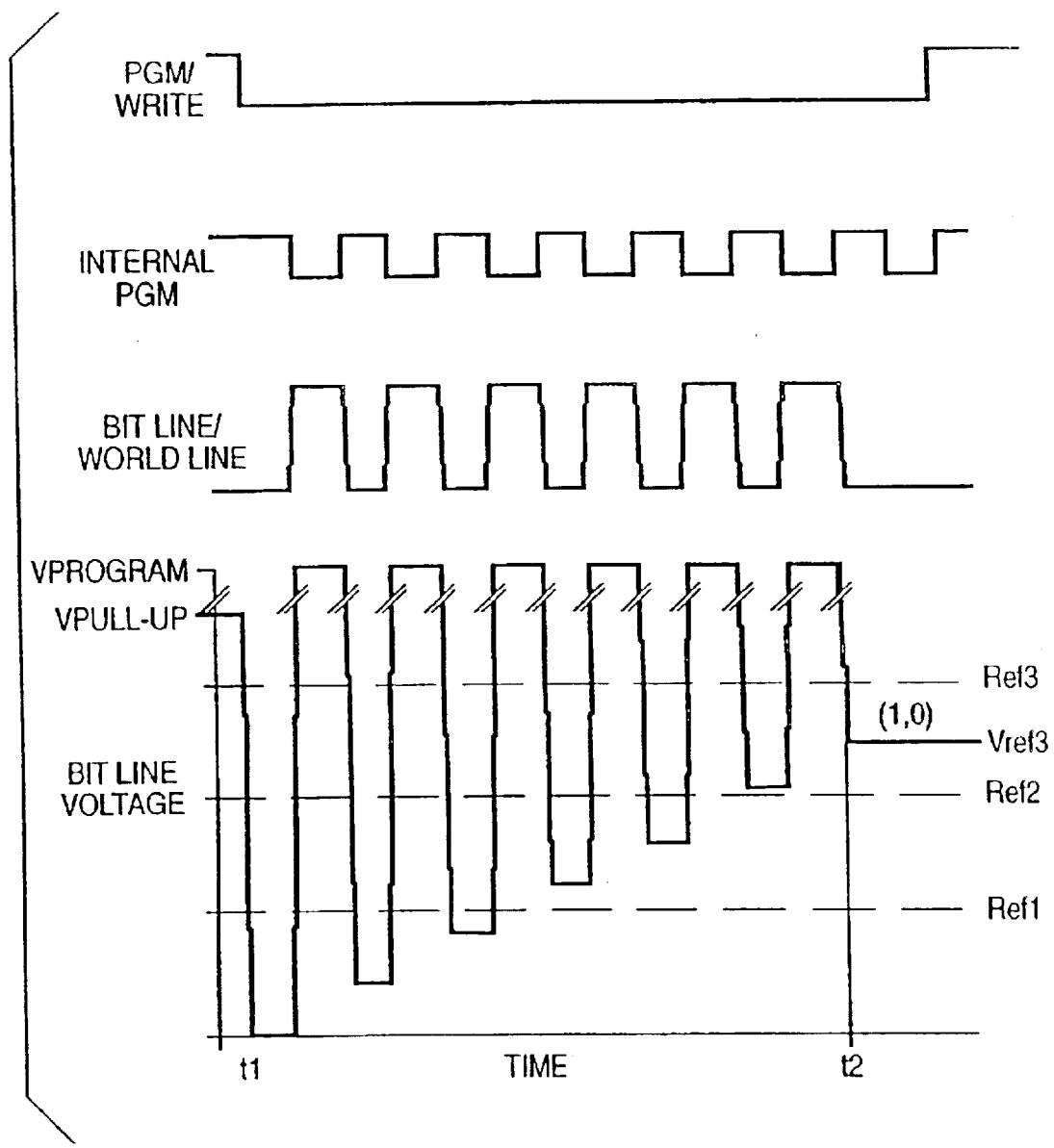
FIG. 12 is a timing diagram illustrating the bit line voltage of a 2-bit EANVM cell during a program/verify process which uses fixed width program pulses.

FIG. 12 illustrates the bit line voltage of the 2-bit EANVM cell 102 as it is being programmed from the fully erased, or fully "on", state (1,1) to the partially "off" state (1,0) using fixed-width program pulses. When the externally applied PGM/Write pulse is applied at time t1, the program/verify timing circuit 208 first initiates a verify cycle to determine the current status of the memory cell 102. This is indicated by the bit line voltage being pulled to a ground condition (corresponding to the erased state) from, in this example, Vpull-up, although prior to time t1, the bit line voltage could be pre-set to any voltage level. Once the cell has been determined to be in the erased state, the first program cycle is initiated. This is represented by the bit line voltage being pulled up to Vprogram. After the first fixed-width programming pulse ends, a verify cycle begins. This is represented by the bit line voltage being pulled down to a point midway between ground potential and Ref1. During each successive verify cycle, the bit line voltage is observed to incrementally increase. This program/verify cycle continues until the bit line voltage has reached the selected programming reference voltage, in this case Vref3, which indicates a memory state of (1,0), at time t2.

Figure 13:
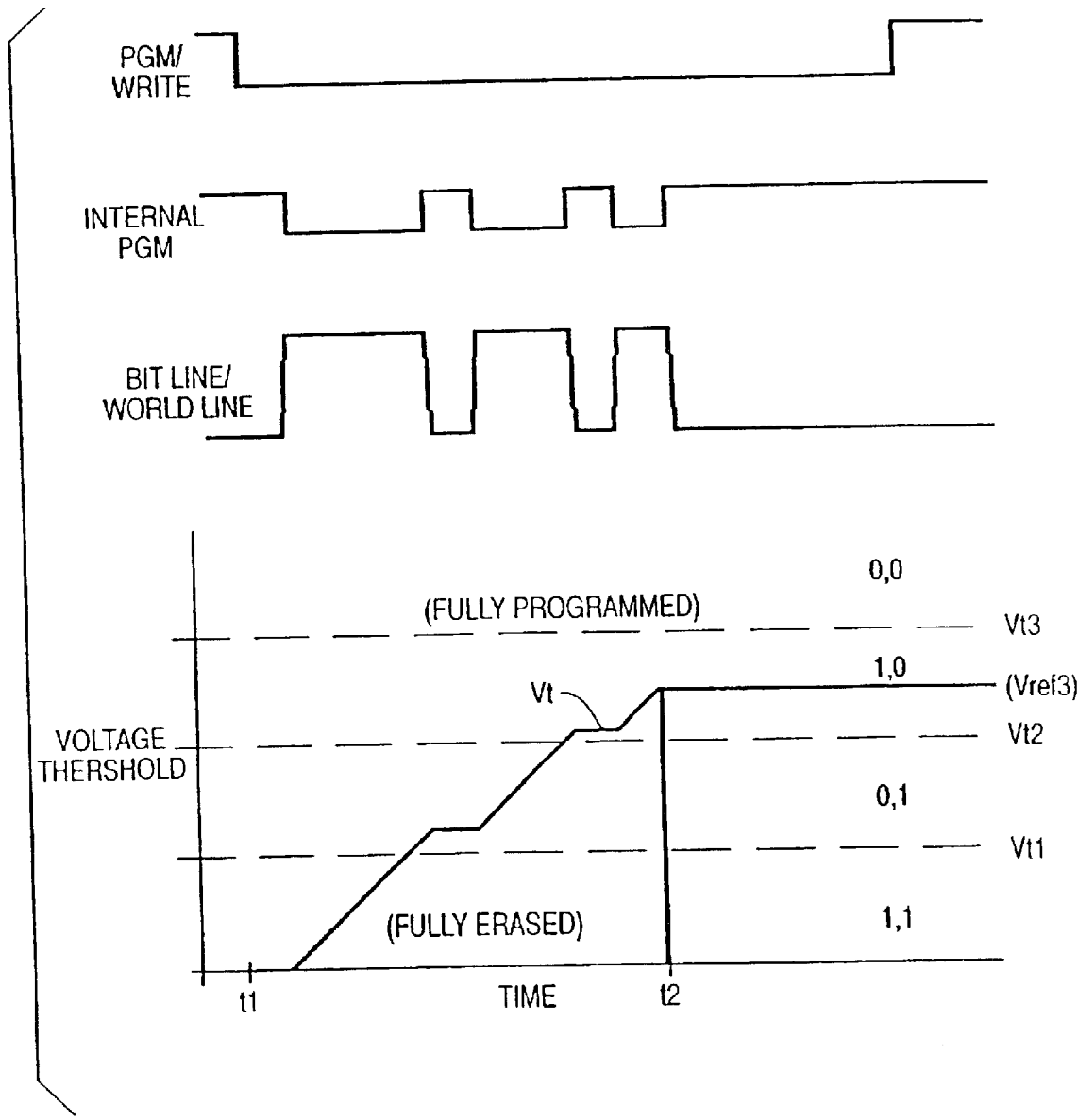
FIG. 13 is a timing diagram illustrating the voltage threshold of a 2-bit EANVM cell during a program/verify cycle using variable width program pulses.

FIG. 13 illustrates how the 2-bit EANVM cell 102 is programmed from the erased (1,1) state to the (1,0) state using a timing circuit 208 that generates variable-width programming pulses. The internal PGM pulses for this implementation start with a low state longer than for the fixed-width implementation of FIGS. 11 and 12. The low state pulse widths grow progressively shorter as the memory cell approaches the target voltage threshold. This approach requires more precise control than the fixed-width approach. However, programming times can be greatly reduced on average.

Figure 14:
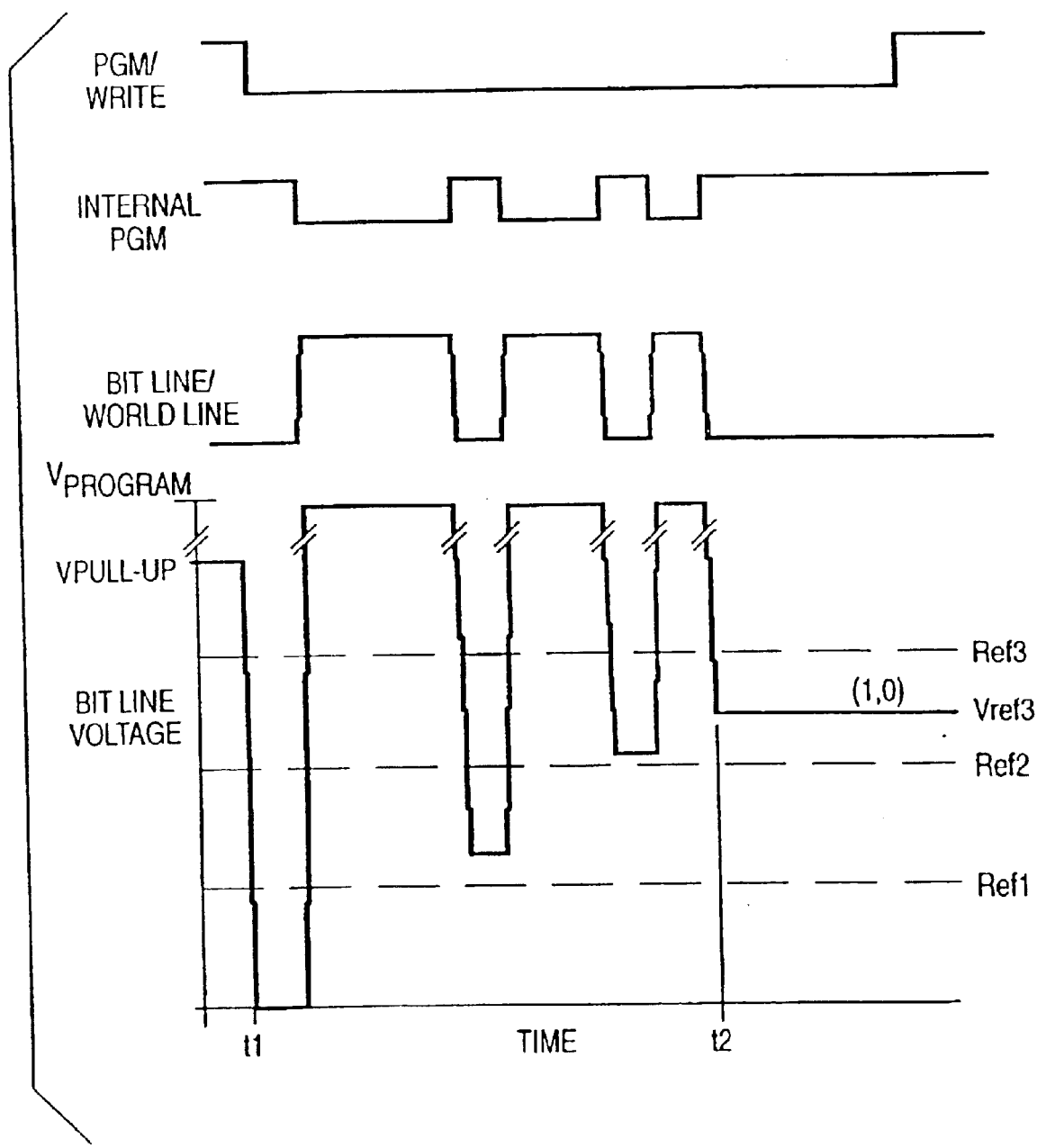
FIG. 14 is a timing diagram illustrating the bit line voltage of a 2-bit EANVM cell during a program/verify process which uses variable width program pulses.

FIG. 14 illustrates the bit line voltage of cell 102 as it is being programmed from the fully erased, or fully "on", state (1,1) to the partially "off" state (1,0) using variable length program pulses. When the externally applied PGM/Write pulse goes to an active low level at time t1, the program/verify timing circuit 208 first initiates a verify cycle to determine the current status of the memory cell 102. This is indicated by the bit line voltage being pulled to a ground condition (corresponding to the erased state) from, in this example, Vpull-up, although prior to time t1, the bit line voltage could be preset to any voltage level. Once the cell has been determined to be in the erased state, the first program cycle is initiated. This is represented by the bit line voltage being pulled up to Vprogram. After the first variable length programming pulse is over, another verify cycle begins. This is represented by the bit line voltage being pulled down to a point midway between Ref1 and Ref2. During each successive verify cycle, the bit line voltage is observed to have increased. This program/verify cycle continues until the bit line voltage has reached the selected programming reference voltage, in this case Vref3, which indicates a memory state of (1,0), at time t2.

As explained above, the programming process for the multi-bit per cell EANVM uses program/verify cycles, to incrementally program the cell. The durations of these cycles are determined by the timing circuit 208. A key element of the system is to provide a programming scheme which provides for accurate programming of the memory cell 102. This is accomplished by matching the pulse widths of the timing pulses of the timing circuitry 208 to the program time of the EANVM cell being used. As seen from FIGS. 11 and 13, a desired voltage threshold actually falls within a range of threshold voltages. If the program pulses are too long, then too much charge may be added to the floating gate of the memory cell 102. This may result in an overshoot of the target voltage threshold, resulting in incorrect data being stored in the memory cell.

The programming pulse width is set such that if the voltage threshold of the cell 102 after the (N-1)Th programming pulse is at a point just below the target voltage threshold, then the (N)Th, or final, program pulse will not cause an overshoot resulting in an over programmed condition for a memory cell.

VI. Embodiments to Establish Reference Voltages for Programming and Memory State Demarcation The program and read circuitry in FIG. 8 uses selectable programming reference voltage signals supplied to a bit line comparator to control programming of the multi-bit memory cell. Programming is accomplished without reading out the cell. This allows for a significant reduction in programming time relative to previous systems that require repeated readout of the memory state of the cell during the programming process.

The following discussion addresses preferred modes of reference signal generation in accordance with the present invention. In principle, the system of FIG. 8 is not limited as to the manner in which the programming and read reference signals are established. The embodiments described in this section, however, implement important new concepts in memory state demarcation and programming control to enhance the reliability of the system.

The embodiments for memory state demarcation are based on a new concept whereby the read reference signals are generated using the programming reference signals, or signals set in substantial correspondence with the programming reference signals. The read reference signals are thus effectively dependent upon the programming reference signals. Because of this dependence, the system design can guarantee that the two sets of signals will closely conform with a predetermined relationship for program margining. For example, as will be seen in the illustrative embodiments, the programming reference voltages of two adjacent memory states may be subjected to voltage division to generate the intervening read reference voltage. The read reference voltage will then fall midway between the two programming reference voltages. As a result, the two programming reference voltages are equally marginate from the read reference voltage.

The embodiments related to programming control particularly address programming reference voltage generation. These embodiments employ reference cells which substantially track changes in operating characteristics of the memory cell (and thus its bit line signal) with changing conditions that affect the operating characteristics, such as temperature, system voltages, or mere passage of time. The use of such reference cells, which preferably have the same (or at least in large part the same) construction as the memory cell, assures a stable relationship between the programming reference voltages and the operating characteristics of the memory cell.

When the reference cells for program voltage generation are used to generate the read reference voltages as well, the read reference voltages will also closely track the changes in operating characteristics of the memory cell. This assures that data stored in the memory cell over a long period of time can be read out accurately. An alternative to using the programming reference cells for this purpose is to use a separate group of reference cells to generate voltages substantially the same as the programming reference voltages. Using the voltages from the separate group of cells to generate the read reference voltages would provide a similar tracking effect of the read reference voltages.

Figure 15:
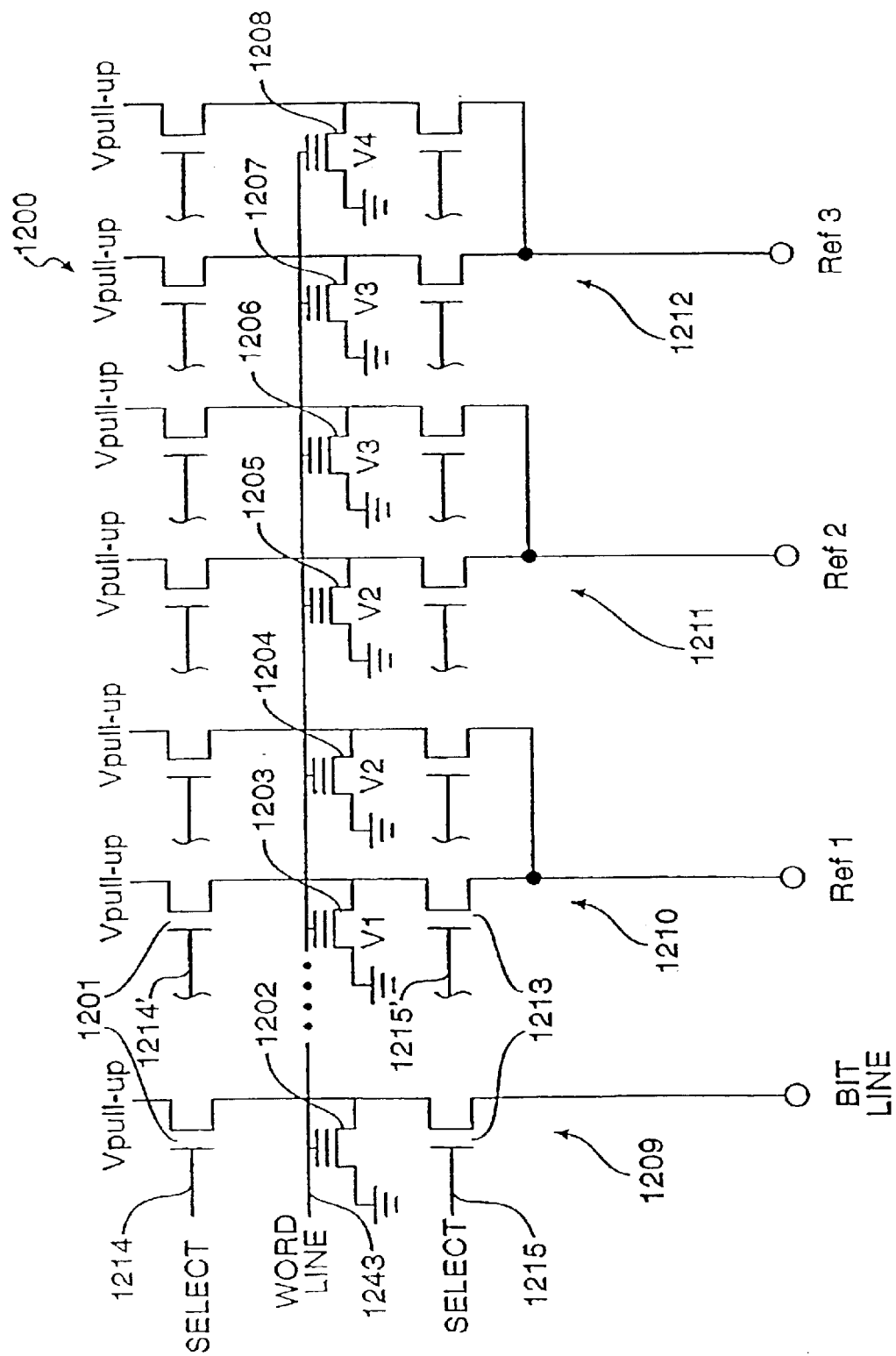
FIG. 15 is a simplified diagram of a circuit for generating read reference voltages for demarcating memory states in a 2-bit per cell EANVM in accordance with the present invention.

FIG. 15 is a simplified diagram illustrating a circuit for generating the read reference voltages Ref1, Ref2, and Ref3. In the form shown, the read reference voltages are generated by corresponding columns 1210, 1211, and 1212 of the circuit, each comprising a pair of reference cells connected in a voltage divider arrangement to generate the corresponding read reference signal. Column 1210 includes a first pair of reference cells 1203, 1204 for generating voltage Ref1. Column 1211 includes a second pair of reference cells 1205, 1206 for generating voltage Ref2. Column 1212 includes a third pair of reference cells 1207, 1208 for generating voltage Ref3. Also shown in FIG. 15 is a bit line column 1209. The bit line column constitutes a portion of the main memory cell array and includes a memory cell 1202.

In order that the read reference voltages will precisely track changes in the memory cell bit line signal with changing conditions that affect the operating characteristics of the memory cells in the main array, reference cells 1203–1208 of the reference voltage generating circuit may, in one preferred mode, be of the same type and construction as their associated memory cells (e.g., cell 1202) of the main array. Thus, all of the cells 1202–1208 in FIG. 15 are assumed to be floating-gate-FET EANVM cells as previously described, all having the same construction. The reference cells, and indeed the reference columns, are preferably fabricated simultaneously with and by the same method as the columns of the main array, as part of the same integrated circuit with the array. Alternatively, the reference columns may be fabricated by way of the same method as the main memory cell array, but at a different time and/or as parts of a different integrated circuit.

Each of the reference cells 1203–1208 in FIG. 15 shares a common word (row select) line 1243 with the memory cell 1202. Each reference cell is also coupled, at its bit line, to a column pull-up voltage Vpull-up and the associated column output terminal via associated select transistors (FETS) 1201 and 1213, which may be NMOS or PMOS devices, for example. The select transistors 1201 are controlled via respective select lines 1214', and the select transistors 1213 are controlled via respective select lines 1215'. The bit lines of each pair of reference cells are connected together, as shown, to form the respective voltage divider arrangements. The memory cell 1202 is also coupled to a column pull-up voltage and the associated column bit line output via a pair of select transistors 1201, 1213 controlled respectively by select lines 1214, 1215.

The reference cells 1203–1208 are pre-programmed at the factory to voltage thresholds corresponding to the programming reference voltages Vref1–Vref4. Specifically, reference cells 1203 and 1204 are programmed respectively to voltage thresholds V1 and V2 to produce voltages equal to programming reference voltages Vref1 and Vref2 on their respective bit lines. Reference cells 1205 and 1206 are respectively programmed to voltage thresholds V2 and V3 to produce voltages equal to programming reference voltages Vref2 and Vref3. Reference cells 1207 and 1208 are respectively programmed to voltage thresholds V3 and V4 to produce voltages equal to programming references Vref3 and Vref4. The programming of the reference cells may be accomplished in any suitable manner. For example, the memory device may be provided with dedicated pins for external application of standard reference voltages to charge the cells. As another alternative, the memory device may incorporate an on-board set of ROM cells having implant dosages for providing bit line voltages corresponding to the desired programming reference voltages. The ROM bit line voltages would be used as programming reference voltages for initially programming the EANVM reference cells. The EANVM reference cells could be selectively coupled to the program verification comparator 202 (FIG. 8) to provide signal Y, and the ROM bit line voltages could be selectively applied to the comparator as signal X to program the EANVM reference cells by a programming operation as previously described. By using programming pulses of small width(s), the reference cells would be programmed with good accuracy. The ROM cells could also be used to reprogram the EANVM reference cells (under predetermined standard conditions) to restore the voltage thresholds of the reference cells to design values, if necessary.

Figure 16:
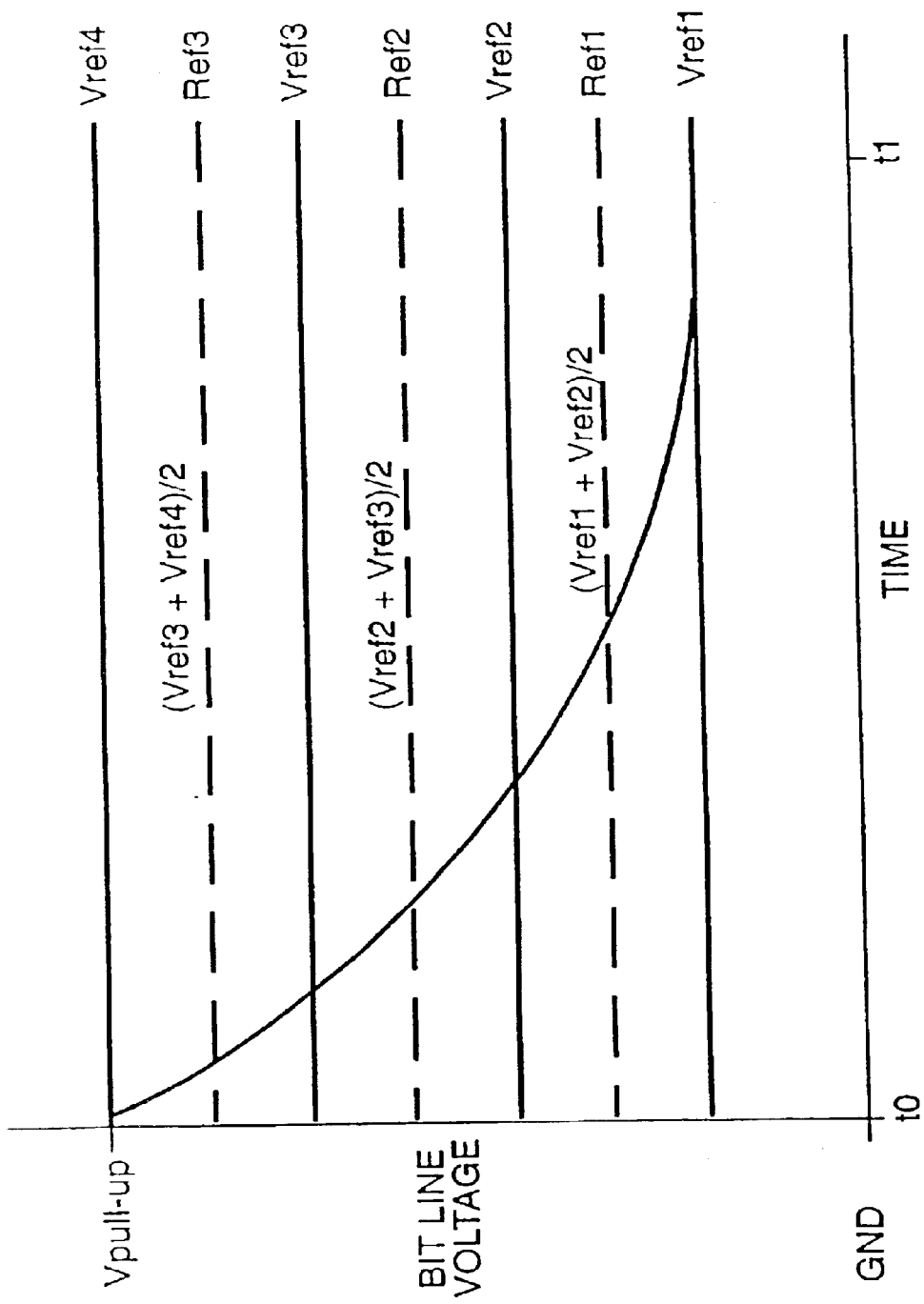
FIG. 16 is a diagram showing the relationship between the read and programming reference voltages in a memory system using the circuit of FIG. 15.

By setting the successive programming reference voltages Vref1–Vref4 at equal intervals and correspondingly programming the voltage thresholds of the reference cells, the reference signal generating circuit shown in FIG. 15 establishes relationships between the programming reference voltages and the read reference voltages as shown in FIG. 16. It should be noted that the assignment of particular memory states to the programming reference voltages Vref1–Vref4 is not a critical matter, although good design practice dictates that the assignments should be consistent throughout the memory system. In a system employing error correction, it may be advantageous to assign the memory states out of binary sequence to facilitate optimization of error detection and correction algorithms. The present discussion assumes assignment of the memory states to the programming reference voltages in a non-binary sequence. Specifically, memory state (1,1) is assigned to the first (lowest) programming reference voltage Vref1, memory state (0,1) is assigned to the second programming reference voltage Vref2, memory state (1,0) is assigned to the third programming reference voltage Vref3, and memory state (0,0) is assigned to the fourth (highest) programming reference voltage Vref4.

As shown in FIG. 16, each read reference voltage is established so that the programming reference voltages for the memory states immediately above and below are equally margined relative to the read reference voltage. More particularly, the read reference voltages are defined as follows:

$$Ref1 = (Vref1 + Vref2)/2$$

$$Ref2 = (Vref2 + Vref3)/2$$

$$Ref3 = (Vref3 + Vref4)/2$$

By virtue of the foregoing relationships, each read reference level will always be optimally margined relative to the adjacent programming reference levels at a position midway between the programming reference levels. Furthermore, because the operating characteristics of the reference cells track variations in the operating characteristics of the memory cell with changing conditions that affect the operating characteristics, the relationships shown in FIG. 16 are maintained throughout such variations. This ensures that data stored in the memory cell over a long period of time can be read out accurately despite differences in temperature, system voltages, etc. at the time of readout relative to the time of data storage. The curve shown in FIG. 16 indicates the bit line voltage of the memory cell during readout, assuming the cell is programmed to programming reference voltage Vref1.

In a practical application, it is possible that the voltages appearing at the outputs of the reference voltage columns 1210, 1211, 1212 will deviate slightly from the design values. Deviations may occur, for example, due to asymmetries in the physical arrangement of the circuit components, which are ordinarily laid out to maximize the compactness of the integrated circuit. Such asymmetries may result in differing line lengths and capacitance effects, for example, relative to the individual reference cells of a given pair. The deviations can be determined in advance by computer simulation of the circuit using standard computer simulation techniques. It is then possible to compensate for the deviations by adding appropriate signal pulling devices on the read reference lines to pull the divided outputs of the reference cells to the design values. Such devices may also be provided for similar reasons on the memory cell bit lines of the main array.

Figure 17:
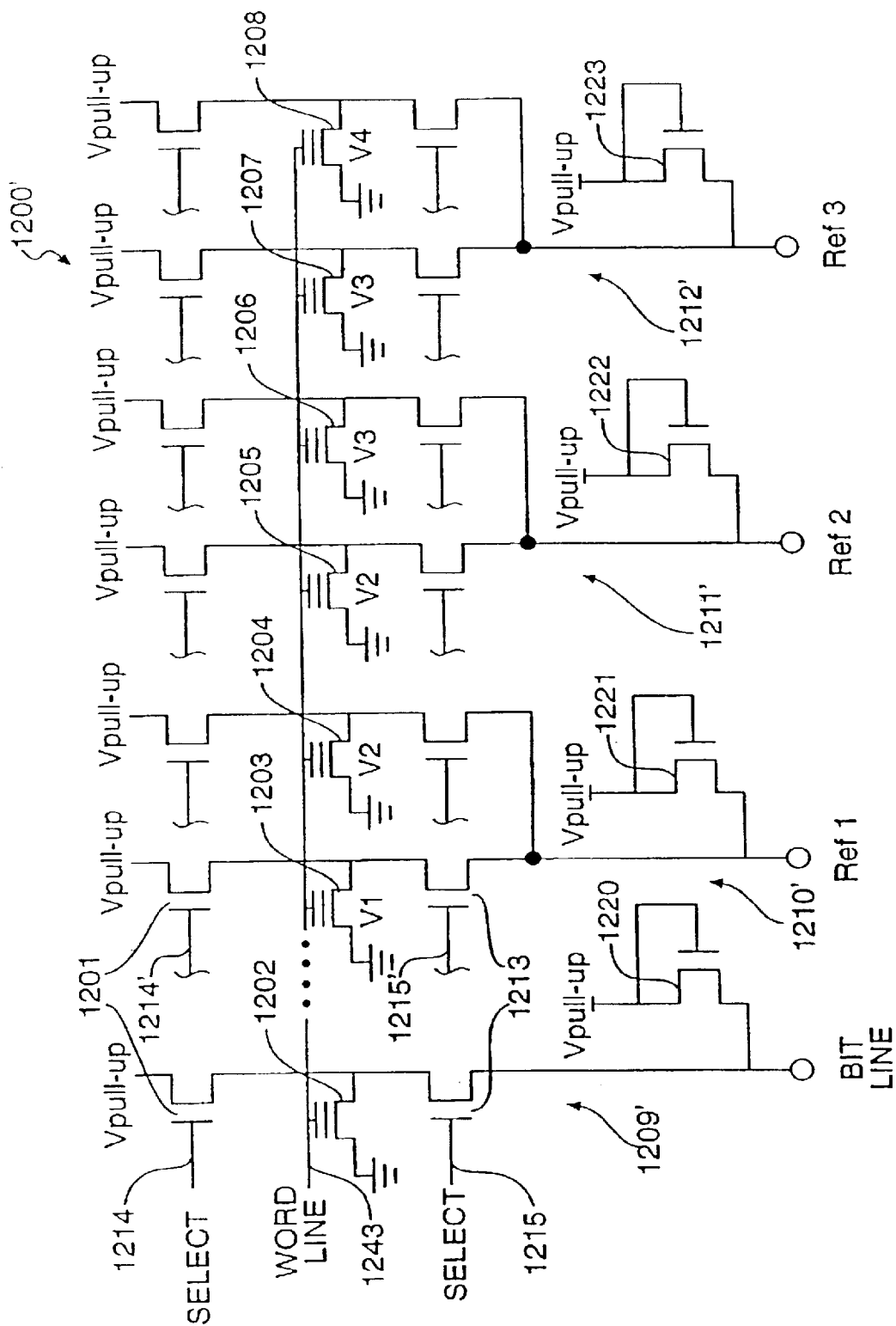
FIG. 17 illustrates a modification to the circuit of FIG. 15.

FIG. 17 shows a read-reference signal generating circuit as just described. The circuit is identical to that of FIG. 15, except for the addition of the aforementioned signal pulling devices. These devices may be constituted by field effect transistors 1220–1223, as shown, or by any other suitable type of device for this purpose, such as capacitor and resistor combinations, etc. The signal pulling devices are preferably connected as closely as possible to the points where the read reference signals (and memory bit line signals) feed into the multi-level sense amplifier for reading out the memory cell. Such an arrangement will optimize the accuracy of the voltage values supplied to the sense amplifier relative to the design values. This is, of course, desirable from the standpoint of high accuracy program margining and memory readout.

Figure 18:
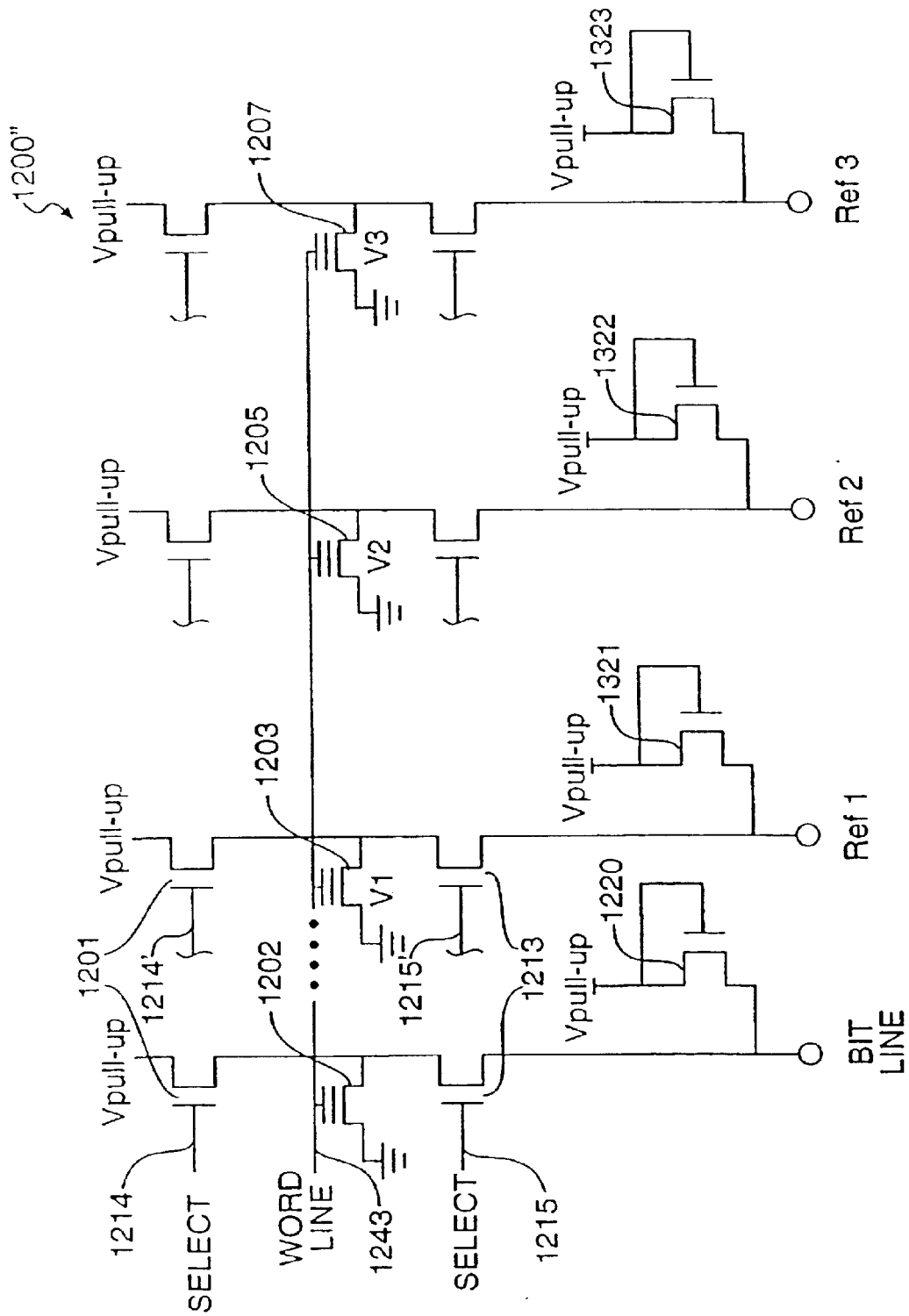
FIG. 18 illustrates another circuit for generating read reference voltages.

FIG. 18 is a simplified diagram showing another embodiment of a circuit 1200" for generating the read reference signals Ref1, Ref2, and Ref3 This circuit is based on the design of the circuit in FIG. 17, but the higher-value reference cell and signal puller of each reference column are replaced by a corresponding single pull-up device 1321, 1322, or 1323 to provide the voltage divider arrangements, as shown. The pull-up devices on the individual read reference lines in FIG. 18 have their respective signal-pulling capacities set so that the read reference voltages will assume the same relationships relative to the programming reference voltages as shown in FIG. 16. It should be noted that this embodiment is less preferred than the arrangement of FIG. 17 from the standpoint of tracking the memory cell, since the pull-up devices 1321, 1322, and 1323 on the read reference lines will not track the memory cell 1202 as closely as the reference cells with changing operating conditions.

Figure 19:
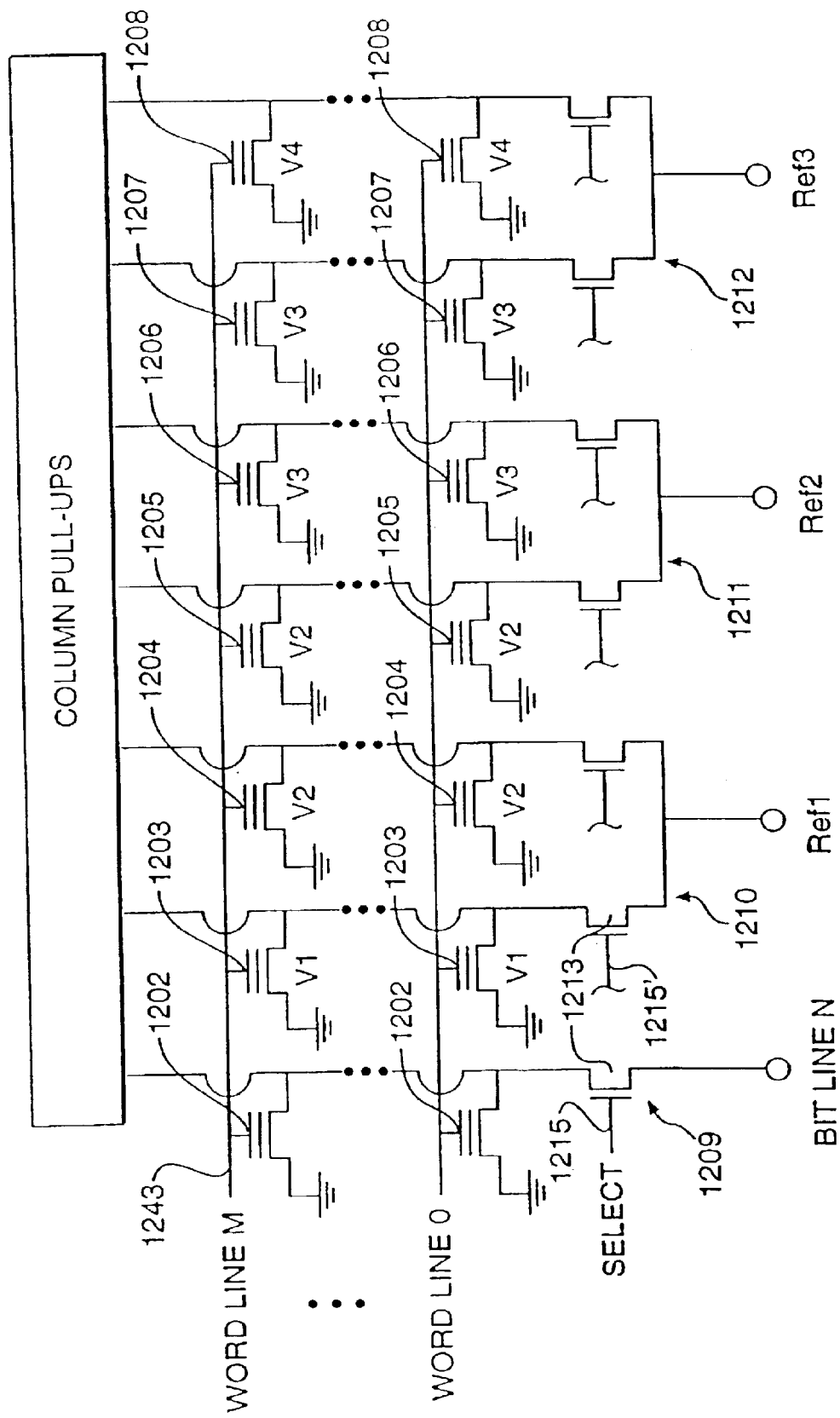
FIG. 19 is a more generalized diagram illustrating how the circuit of FIG. 16 can be applied to a 2-bit per cell EANVM array.

FIG. 19 is a more generalized diagram illustrating how the reference signal generating circuit of FIG. 15 can be applied to a memory array. For convenience in FIG. 19, the select line 1214 and select transistors 1201, which are not required but may be desirable to reduce energy consumption, for example, have been replaced by a generic network of column pull-ups (so designated).

As shown in FIG. 19, each row of memory cells in the array is provided with a corresponding set of reference cells 1203–1208 connected to form voltage divider arrangements as previously described. Each set (row) of reference cells would be selected individually for providing signals on the reference column bit lines for readout of a memory cell of the corresponding row of the main array. Although it is consistent with the principles of the present invention to use a single set of reference cells for all of the memory cells of the array (in which case the reference cells need not share the word line of any row of the array), the use of dedicated sets of reference cells for each row of the array is preferred for accuracy. More particularly, the use of dedicated reference cells allows for better symmetry in the arrangement of each set of reference cells relative to that of the corresponding row of memory cells within the overall memory circuit. For example, a reference cell for row M of the memory array in FIG. 20 will have the same number and type of components connected between its bit line terminal and the reference column output as does each corresponding memory cell 1202 between its bit line terminal and the column bit line output. Also, the line length from the bit line terminal of the reference cell to the reference column output can made close to or the same as the line length from the bit line terminal of each corresponding memory cell to its associated column bit line output. Signal pulling devices may be added on the bit and read reference lines in a manner similar to FIG. 17. In this case, the signal pulling capacity of each device would be determined by suitable calculation during the computer simulation process to provide the best overall accuracy of the signal levels provided by the different cells within each column of the system.

Figure 20:
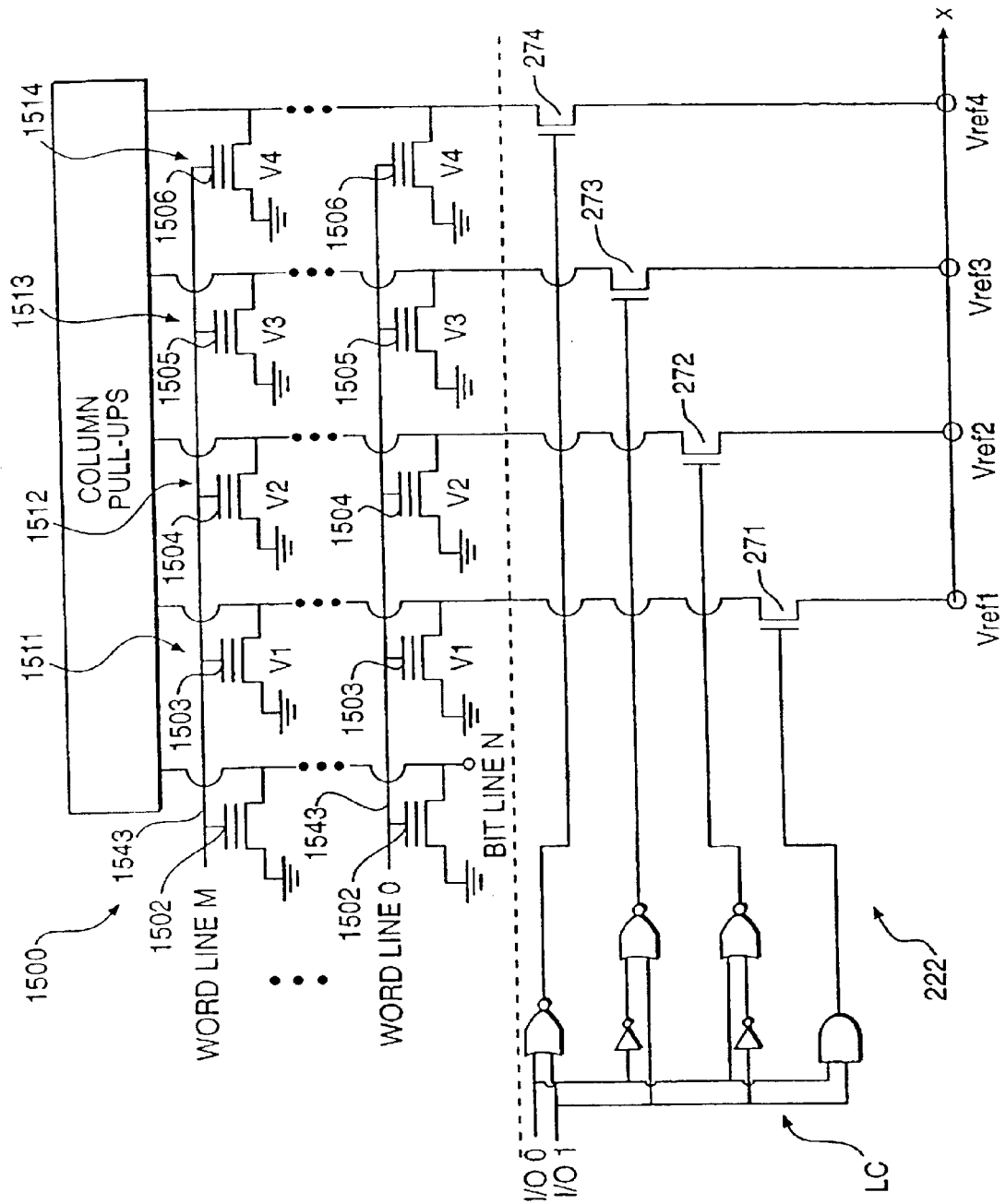
FIG. 20 is a simplified diagram of a circuit for generating programming reference voltages in accordance with the present invention. The circuit is shown coupled to a verify reference select circuit for selecting among the programming reference voltages.

FIG. 20 is a simplified diagram showing a circuit 1500 (above the dashed line) for generating programming references Vref1–Vref4 and an associated verify reference select circuit 222 (below the dashed line) for outputting the selected signal X for program verification. As shown in FIG. 20, each row of the memory array is coupled with a set of reference cells 1503–1506 having the same construction as the memory cells. The reference cells need not be part of the same integrated circuit as the memory array, but they are preferably fabricated simultaneously with and by the same process as the array, as part of the same integrated circuit, for the reasons previously explained. The use of a dedicated set of programming reference cells for each row of the array is preferable for the same reasons as were discussed in connection with the arrangement of FIG. 20. The reference cells for producing the programming reference signals Vref1–Vref4 are arranged in corresponding columns 1511–1514, with their bit line terminals commonly connected to a corresponding bit line and a network of column pull-ups (so designated). Each set (row) of reference cells would be individually selected, via an associated word line 1543, for providing signals on the corresponding column bit lines for programming verification of a memory cell of the corresponding row of the main memory array.

Each reference cell 1503 in column 1511 is pre-programmed at the factory (for example, as previously described in connection with FIG. 15) to the voltage threshold V1 to produce voltage Vref1 on the column bit line. Each reference cell 1504 in column 1512 is pre-programmed to the voltage threshold V2 to produce voltage Vref2 on the column bit line. Each reference cell in column 1513 is pre-programmed to the voltage threshold V3 to produce voltage Vref3 on the column bit line. Each reference cell in column 1514 is pre-programmed to the voltage threshold V4 to produce voltage Vref4 on the column bit line. Signal pulling devices may be added on the column bit lines as previously explained if necessary to compensate for deviations of the column bit line voltages due to effects of layout asymmetries and the like.

The bit lines of columns 1511–1514 are coupled to corresponding select transistors (e.g., FETs) 271–274 of verify reference select circuit 222. The select transistors, which may be NMOS or PMOS devices, for example, can be controlled by a simple logic circuit, such as the logic circuit LC shown in FIG. 20. The circuit LC in FIG. 20 operates in accordance with the following truth table. Note that the signals I/O0 and I/O1 are provided as inputs from the input latch/buffer 224 (see FIG. 8).

| I/O0 | I/O1 | Vref1 Select | Vref2 Select | Vref3 Select | Vref4 Select |
|---|---|---|---|---|---|
| 0 | 0 | L | L | L | H |
| 1 | 0 | L | L | H | L |
| 0 | 1 | L | H | L | L |
| 1 | 1 | H | L | L | L |

Figure 21A:
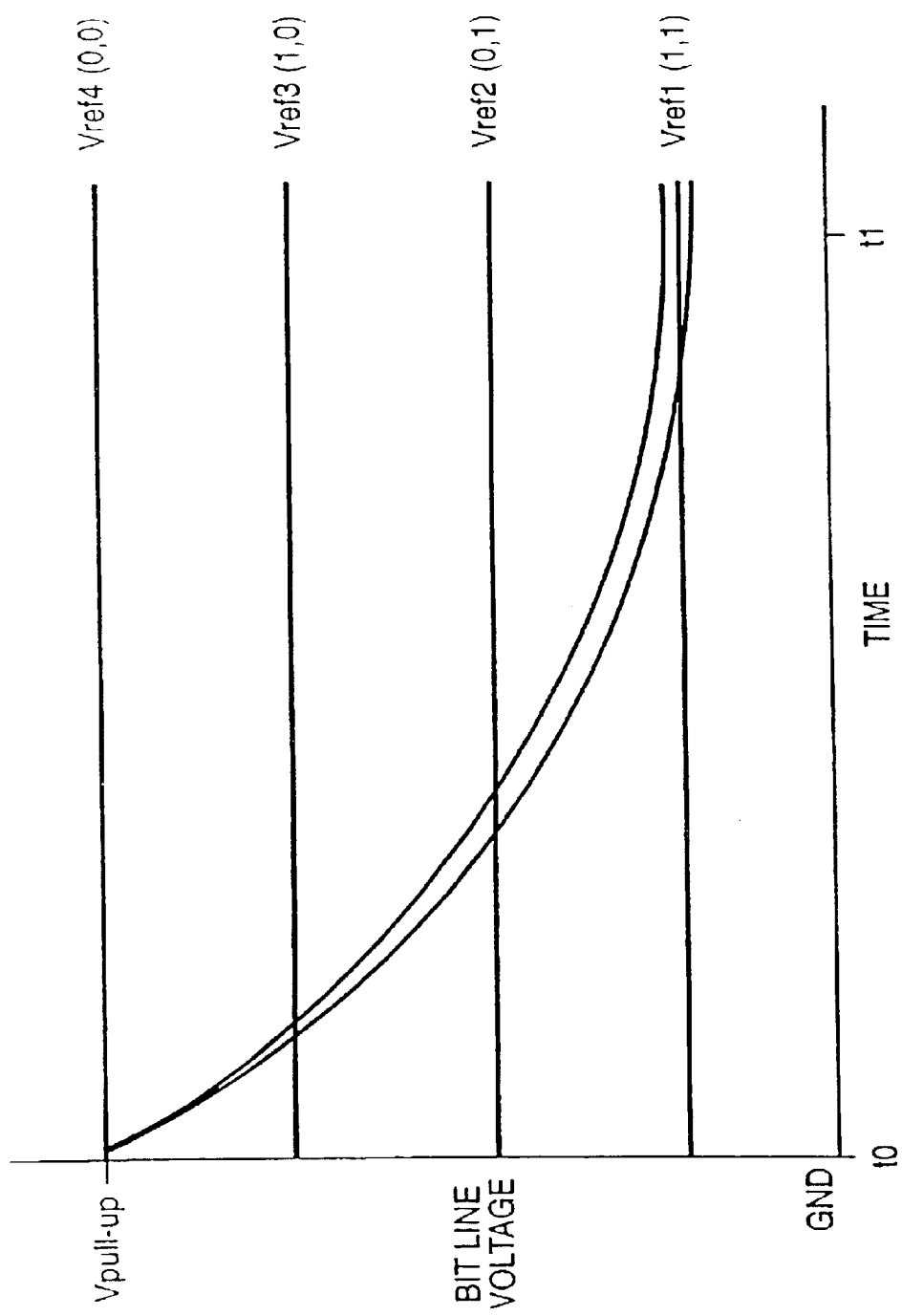
FIGS. 21A–21D are timing diagrams of the bit line voltage during readout of a 2-bit EANVM cell programmed according to programming reference signals for each of the four possible memory states.
Figure 21B:
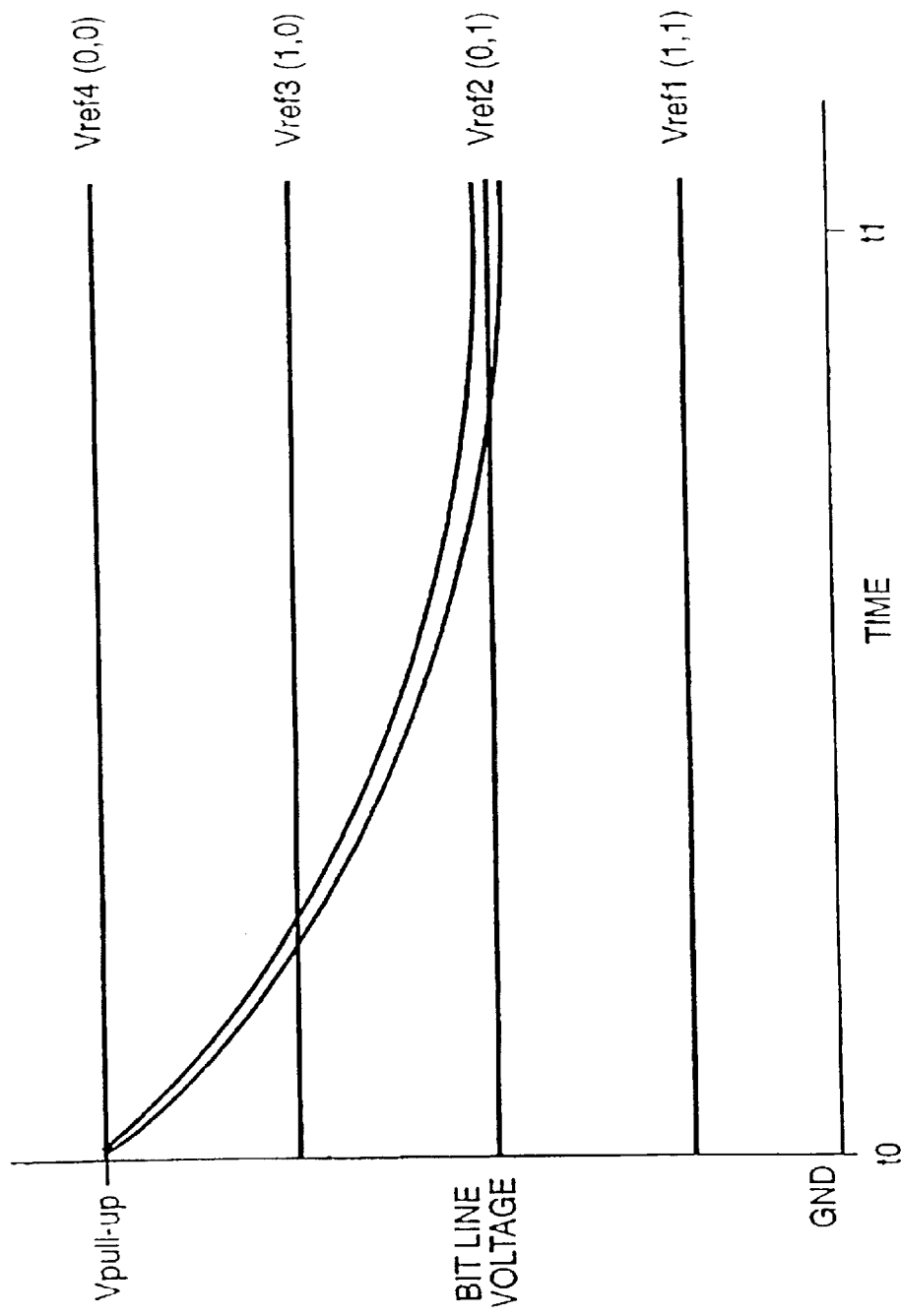
Figure 21C:
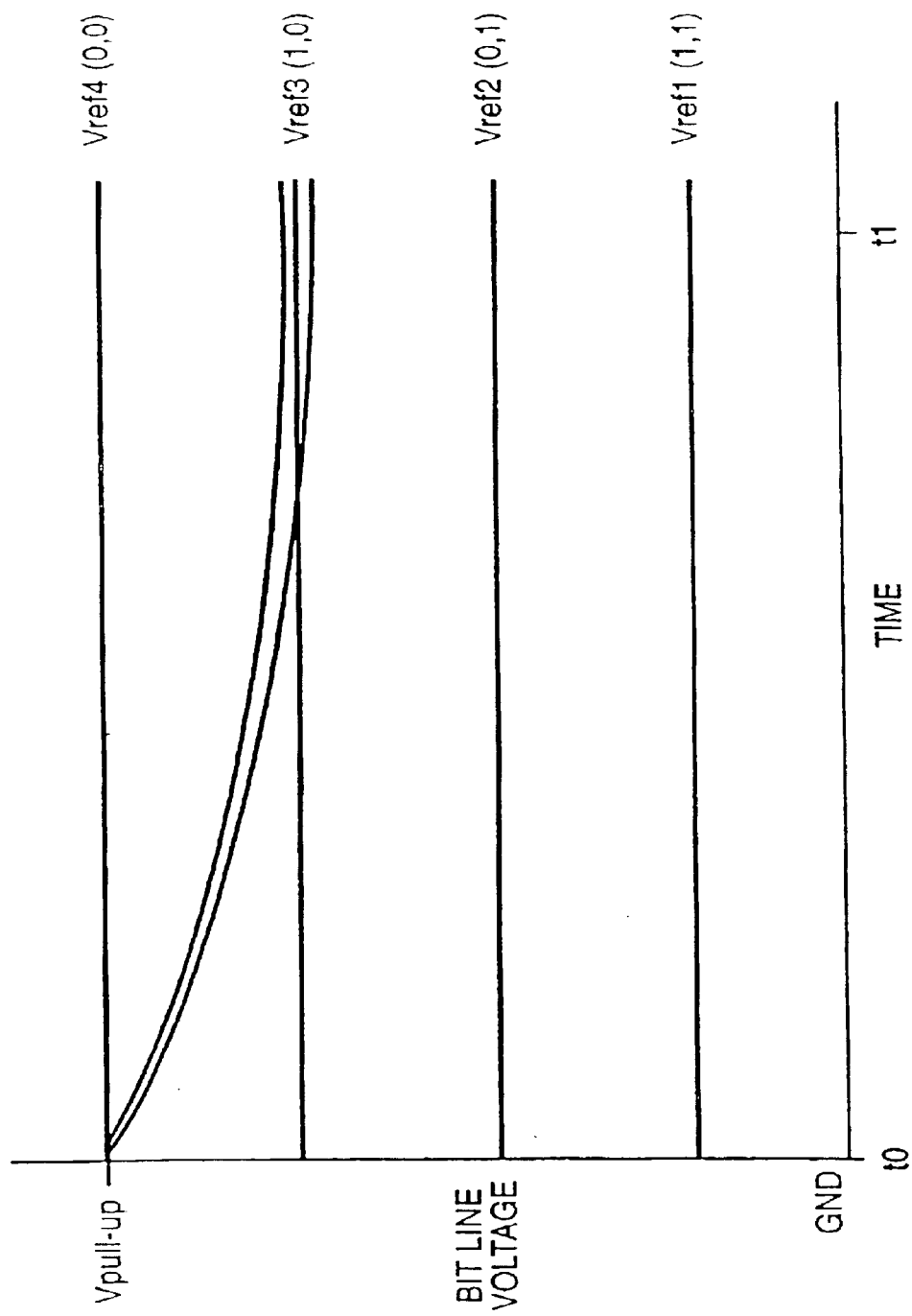
Figure 21D:
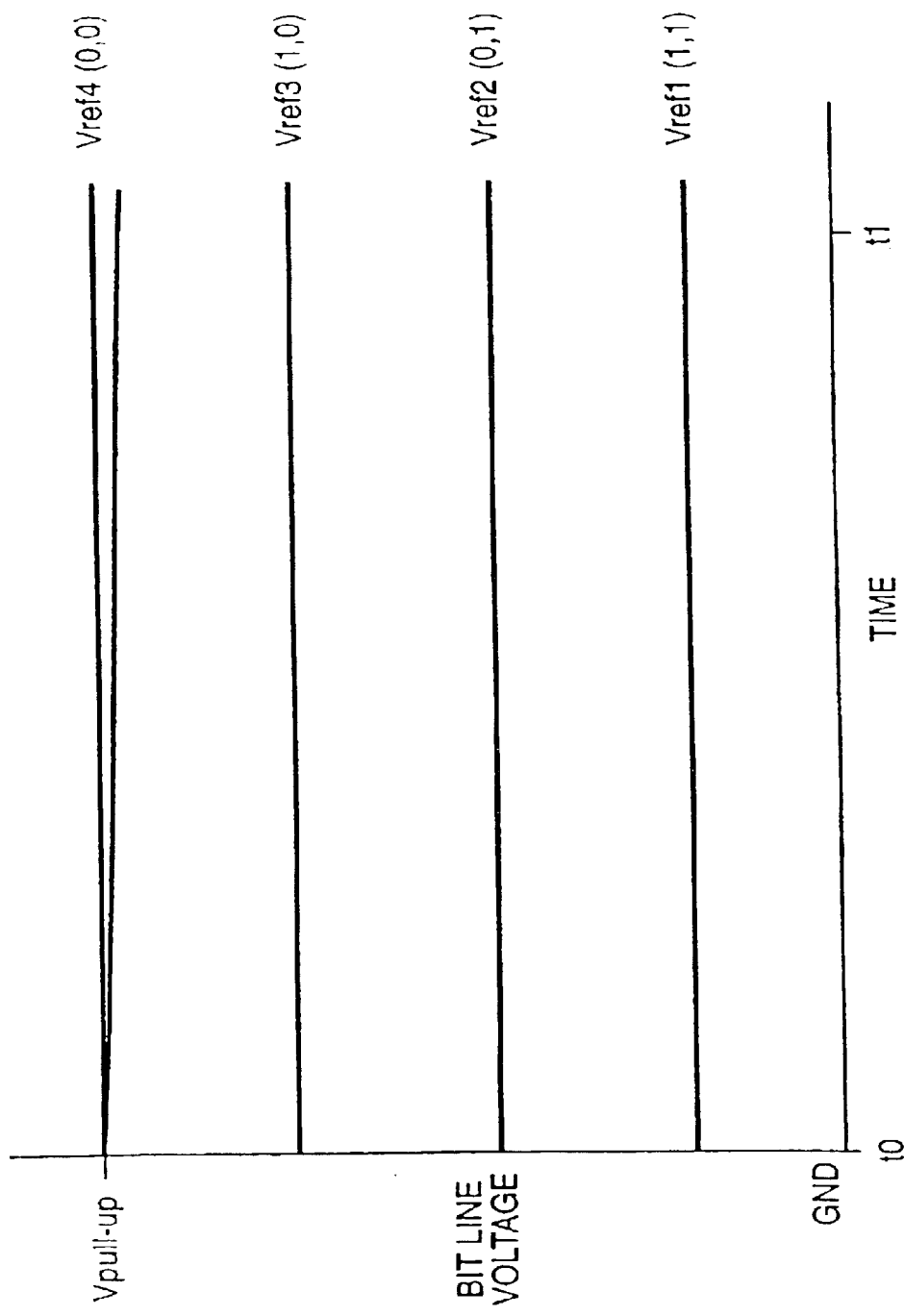

FIGS. 21A–21D are readout timing diagrams showing the bit line voltage level of a selected memory cell in FIG. 20 after programming to each of the four memory states. In each diagram, at time t0, the bit line voltage is at its pre-charged value of Vpull-up, which is at or very near the value of Vref4. At time t1, the voltage level has dropped to the range indicated by the two closely spaced lines which are centered around the Vref level for the programmed state. The two lines indicate that there is a slight range of tolerance for the bit line voltage level relative to the programming voltage reference level during read out of the memory cell. FIG. 21A illustrates the bit line voltage when the memory cell has been programmed to the voltage threshold V1 corresponding to the programming reference level Vref1. FIG. 21B illustrates the bit line voltage when the memory cell has been programmed to the voltage threshold V2 corresponding to the programming reference level Vref2. FIG. 21C illustrates the bit line voltage when the memory cell has been programmed to the voltage threshold V3 corresponding to the programming reference level Vref3. FIG. 21D illustrates the bit line voltage when the memory cell has been programmed to the voltage threshold V4 corresponding to the programming reference level Vref4.

Figure 22:
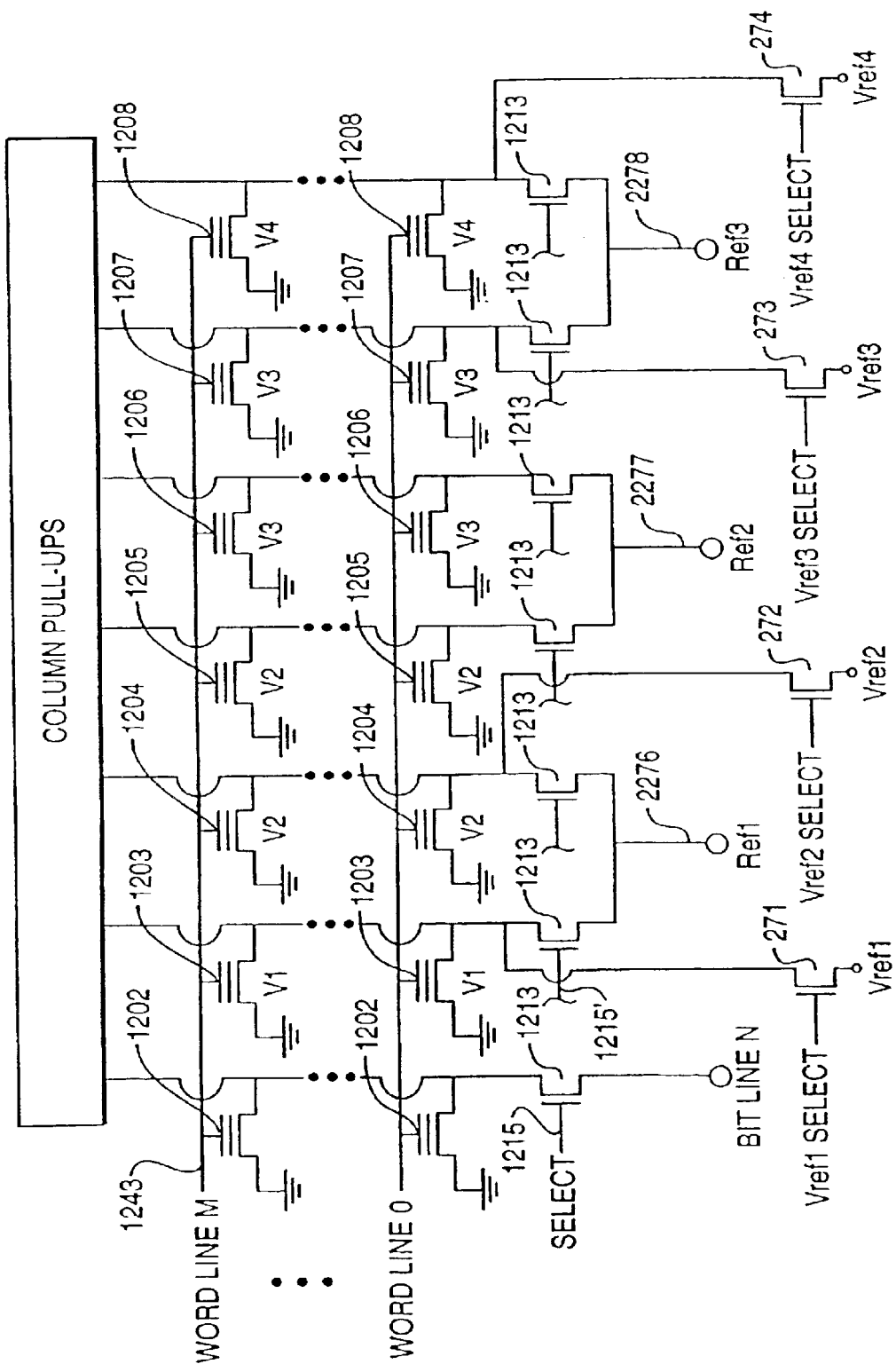
FIG. 22 is a simplified diagram illustrating a combined circuit for generating both read and programming reference voltages in accordance with the present invention.

While the read reference and programming reference generating circuits have been shown and described as separate circuits above, the circuits may readily be combined to share components as shown in FIG. 22. This is possible because the programming reference signals and the read reference signals need not be used at the same time. More particularly, the programming reference signals need only be used during the memory cell programming operation, whereas the read reference signals need only be used during the memory cell readout operation.

The circuit shown in FIG. 22 is a modification of the circuit of FIG. 19. In the circuit of FIG. 22, the bit line of reference cells 1203 is connected to provide programming reference voltage Vref1, the bit line of reference cells 1204 is connected to provide programming reference voltage Vref2, the bit line of reference cells 1207 is connected to provide programming reference voltage Vref3, and the bit line of reference cells 1208 is connected to provide programming reference voltage Vref4. Select transistors 271–274 correspond to the select transistors shown in FIG. 20.

Figure 23:
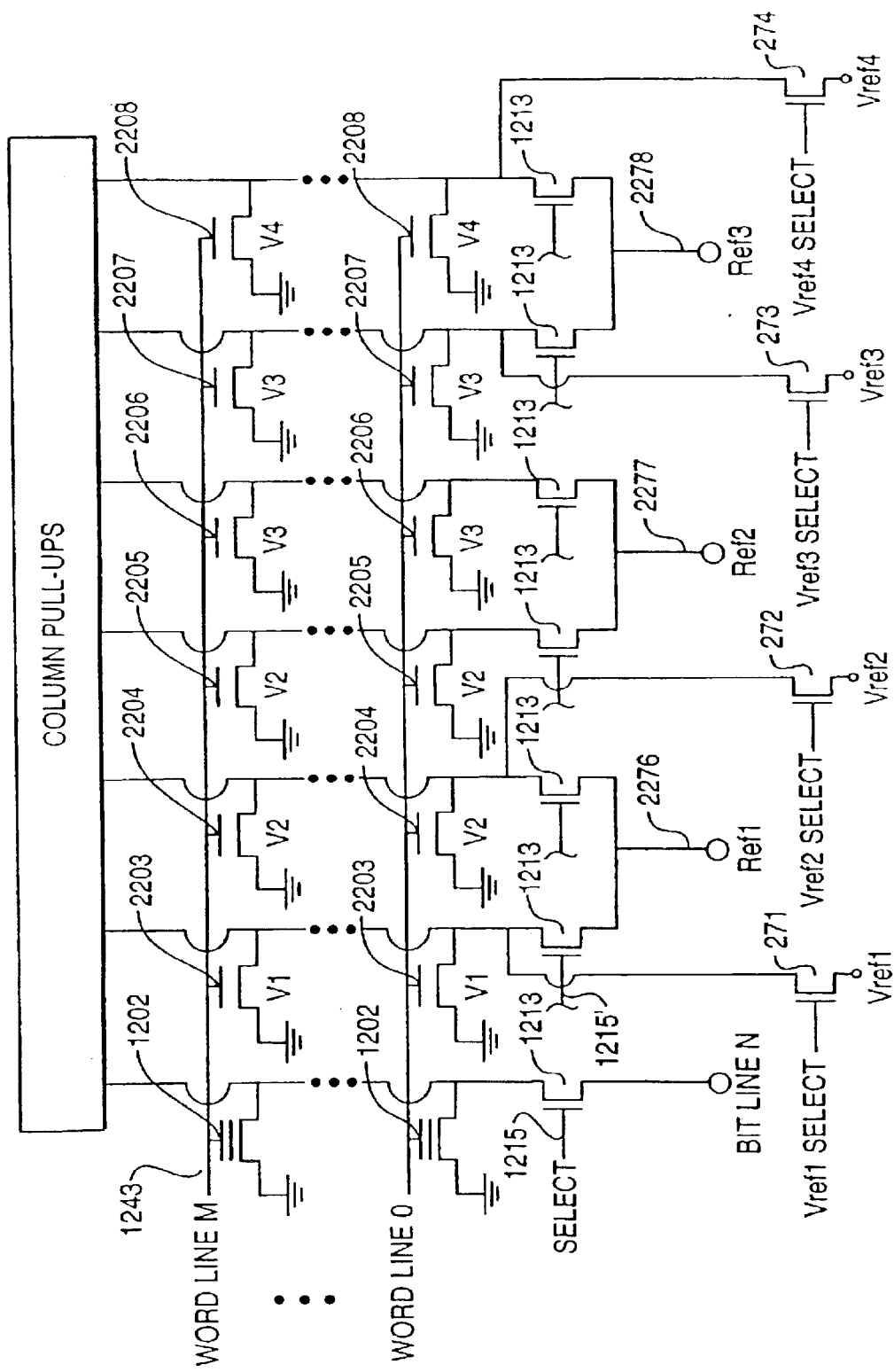
FIG. 23 is a diagram similar to FIG. 22, but in which the reference cells are in the form of ROM cells.

FIG. 23 shows a modification of the circuit in FIG. 22, in which the EANVM reference cells 1203–1208 are replaced by ROM cells 2203–2208, respectively. The use of ROM cells as reference cells is advantageous because it avoids the initial programming requirement of EANVM reference cells, although the tracking effect of the reference signals relative to the EANVM cells of the main array may be reduced somewhat. To maximize the tracking effect, corresponding portions of the ROM cells and the EANVM cells can be fabricated by the same process steps. For example, the sources, drains, channel regions, and control gates of the EANVM cells and the ROM cells may be fabricated in this manner, with separate process steps being used to provide the EANVM floating gates and the ROM threshold implants.

As previously stated, the illustrative embodiments described herein are merely exemplary, and numerous changes and modifications can be made consistent with the principles of the invention. For example, although the invention has been explained in terms of voltage-based memory systems which utilize voltage signals from the memory and reference cells, the principles of the invention are equally applicable to current-based memory systems in which current levels rather than voltage levels are utilized.

What is claimed is:

1. A non-volatile semiconductor memory device, comprising:
a plurality of non-volatile memory cells each of which has a storage structure and an electrically alterable parameter representing data of at least two bits, wherein the electrically alterable parameters of the plurality of non-volatile memory cells are shiftable to at least three mutually different first, second and third program states from an erase state;
reference value generating circuitry generating first, second and third programming reference values for programming the first, second and third program states, and generating first, second and third read reference values, which are different from the first, second and third programming reference values, for reading the first, second and third program states; and
sensing/program-verifying circuitry receiving the parameter of one non-volatile memory cell, the first, second and third read reference values and the first, second and third read programming reference values;
wherein the first read reference value is allocated between the first program state and the second program state, the second read reference value is allocated between the second program state and the third program state, and the third read reference value is allocated between the third program state and the erase state,
wherein the second read reference value is allocated substantially at a midpoint between the second program state and the third program state, and the third read reference value is shifted toward the second program state from a midpoint between the third program state and the erase state,
wherein the sensing/program-verifying circuitry generates data of at least two bits represented by the electrically alterable parameter, verifies whether the electrically alterable parameter is shifted to the parameter indicating a selected one state of the first, second and third program states, and programs the electrically alterable parameter until it has been verified that the electrically alterable parameter has been shifted to the selected one state,
wherein the first, second and third programming reference values are used for verifying whether the electrically alterable parameter is shifted to the first, second or third program state, and the first, second and third read reference values are used for detecting whether the electrically alterable parameter is near to the first, second or third program state, and
wherein the reference value generating circuitry generates the first, second and third programming reference values and the first, second and third read reference values such that one of the first, second and third programming reference values and the first, second and third read reference values is shifted from and dependent upon the other.

2. A non-volatile semiconductor memory device according to claim 1,
wherein a shift amount of one of the first, second and third read reference values from the corresponding one of the first, second and third programming reference values is dependent upon the corresponding one of the first, second and third programming reference values.

3. A non-volatile semiconductor memory device according to claim 1,
wherein the reference value generating circuitry includes:
a first reference value generating circuit which generates the first programming reference value and the first read reference value,
a second reference value generating circuit which generates the second programming reference value and the second read reference value, and
a third reference value generating circuit which generates the third programming reference value and the third read reference value, and wherein each of the first reference value generating circuit, the second reference value generating circuit and the third reference value generating circuit includes an element causing the corresponding read reference value and the corresponding programming reference value to have different values.

4. A non-volatile semiconductor memory device according to claim 3,
wherein each of the first reference value generating circuit, the second reference value generating circuit and the third reference value generating circuit further includes a reference cell which has substantially the same construction as each of said plurality of memory cells, and the reference cell and the element of each reference value generating circuit cooperate to provide a predetermined difference between the corresponding read and programming reference values.

5. A non-volatile semiconductor memory device according to claim 1,
wherein each read reference value is dependent upon the corresponding programming reference value.

6. A non-volatile semiconductor memory device according to claim 1,
wherein a conductivity value of the one non-volatile memory cell is decreased in order of the state indicating the erase state, the first program state, the second program state and the third program state, and
wherein the programming states of non-volatile memory cells of one of a byte, a block and a chip level can be shifted to the erase state by an erase operation.

7. A non-volatile semiconductor memory device according to claim 6,
wherein each of the plurality of non-volatile memory cells has a floating gate to which electrons are capable of being injected from a channel by hot electron injection.

8. A non-volatile semiconductor memory device according to claim 6,
wherein each of the plurality of non-volatile memory cells has a floating gate to which electrons are capable of being injected from a channel by Fowler-Nordheim tunneling.

9. A non-volatile semiconductor memory device according to claim 2,
wherein a conductivity value of the one non-volatile memory cell is decreased in order of the state indicating the erase state, the first program state, the second program state and the third program state, and
wherein the programming states of non-volatile memory cells of one of a byte, a block and a chip level can be shifted to the erase state by an erase operation.

10. A non-volatile semiconductor memory device according to claim 9,
wherein each of the plurality of non-volatile memory cells has a floating gate to which electrons are capable of being injected from a channel by hot electron injection.

11. A non-volatile semiconductor memory device according to claim 9,
wherein each of the plurality of non-volatile memory cells has a floating gate to which electrons are capable of being injected from a channel by Fowler-Nordheim tunneling.

12. A non-volatile semiconductor memory device according to claim 3,
wherein a conductivity value of the one non-volatile memory cell is decreased in order of the state indicating the erase state, the first program state, the second program state and the third program state, and
wherein conductivity values of non-volatile memory cells of one of a byte, a block and a chip level can be shifted to the erase state by an erase operation.

13. A non-volatile semiconductor memory device according to claim 12,
wherein each of the plurality of non-volatile memory cells has a floating gate to which electrons are capable of being injected from a channel by hot electron injection.

14. A non-volatile semiconductor memory device according to claim 12,
wherein each of the plurality of non-volatile memory cells has a floating gate to which electrons are capable of being injected from a channel by Fowler-Nordheim tunneling.

15. A non-volatile semiconductor memory device according to claim 4,
wherein a conductivity value of the one non-volatile memory cell is decreased in order of the state indicating the erase state, the first program state, the second program state and the third program state, and
wherein conductivity values of non-volatile memory cells of one of a byte, a block and a chip level can be shifted to the erase state by an erase operation.

16. A non-volatile semiconductor memory device according to claim 15,
wherein each of the plurality of-non-volatile memory cells has a floating gate to which electrons are capable of being injected from a channel by hot electron injection.

17. A non-volatile semiconductor memory device according to claim 15,
wherein each of the plurality of non-volatile memory cells has a floating gate to which electrons are capable of being injected from a channel by Fowler-Nordheim tunneling.

18. A non-volatile semiconductor memory device according to claim 5,
wherein a conductivity value of the one non-volatile memory cell is decreased in order of the state indicating the erase state, the first program state, the second program state and the third program state, and
wherein conductivity values of non-volatile memory cells of one of a byte, a block and a chip level can be shifted to the erase state by an erase operation.

19. A non-volatile semiconductor memory device according to claim 18,
wherein each of the plurality of non-volatile memory cells has a floating gate to which electrons are capable of being injected from a channel by hot electron injection.

20. A non-volatile semiconductor memory device according to claim 18,
wherein each of the plurality of non-volatile memory cells has a floating gate to which electrons are capable of being injected from a channel by Fowler-Nordheim tunneling.

21. A non-volatile semiconductor memory device according to claim 1,
wherein the first, second and third read reference values are dependent upon the first, second and third programming reference values, respectively.

* * * * *